United States Patent
Das

(10) Patent No.: US 10,964,824 B2
(45) Date of Patent: *Mar. 30, 2021

(54) TWO-DIMENSIONAL ELECTROSTRICTIVE FIELD EFFECT TRANSISTOR (2D-EFET)

(71) Applicant: The Penn State Research Foundation, University Park, PA (US)

(72) Inventor: Saptarshi Das, State College, PA (US)

(73) Assignee: THE PENN STATE RESEARCH FOUNDATION, University Park (PA)

( * ) Notice: Subject to any disclaimer, the term of this patent is extended or adjusted under 35 U.S.C. 154(b) by 0 days.

This patent is subject to a terminal disclaimer.

(21) Appl. No.: 16/916,454

(22) Filed: Jun. 30, 2020

(65) Prior Publication Data

US 2020/0335637 A1 Oct. 22, 2020

Related U.S. Application Data

(63) Continuation of application No. 15/945,207, filed on Apr. 4, 2018, now Pat. No. 10,734,531.

(60) Provisional application No. 62/523,520, filed on Jun. 22, 2017.

(51) Int. Cl.
| | |
|---|---|
| *H01L 29/84* | (2006.01) |
| *H01L 29/66* | (2006.01) |
| *H01L 29/51* | (2006.01) |
| *H01L 29/24* | (2006.01) |
| *H01L 29/76* | (2006.01) |
| *H01L 29/778* | (2006.01) |
| *H01L 29/10* | (2006.01) |

(52) U.S. Cl.
CPC .......... *H01L 29/84* (2013.01); *H01L 29/1033* (2013.01); *H01L 29/24* (2013.01); *H01L 29/516* (2013.01); *H01L 29/66969* (2013.01); *H01L 29/66977* (2013.01); *H01L 29/7606* (2013.01); *H01L 29/778* (2013.01)

(58) Field of Classification Search
CPC ........................................................ H01L 29/84
See application file for complete search history.

(56) References Cited

U.S. PATENT DOCUMENTS

| | | | |
|---|---|---|---|
| 4,633,120 A | 12/1986 | Sato et al. | |
| 5,255,972 A | 10/1993 | Shirasu | |
| 6,570,437 B2 | 5/2003 | Park et al. | |
| 7,432,542 B2 | 10/2008 | Ishimaru | |

(Continued)

OTHER PUBLICATIONS

Chhowalla et al., Two-dimensional semiconductors for transistors, Nature Reviews, Materials, vol. 1, Nov. 2016.

(Continued)

*Primary Examiner* — Thao X Le
*Assistant Examiner* — Laura M Dykes
(74) *Attorney, Agent, or Firm* — Dinsmore & Shohl LLP

(57) ABSTRACT

A device and method for manufacturing a two-dimensional electrostrictive field effect transistor having a substrate, a source, a drain, and a channel disposed between the source and the drain. The channel is a two-dimensional layered material and a gate proximate the channel. The gate has a column of an electrostrictive or piezoelectric or ferroelectric material, wherein an electrical input to the gate produces an elongation of the column that applies a force or mechanical stress on the channel and reduces a bandgap of two-dimensional material such that the two-dimensional electrostrictive field effect transistor operates with a subthreshold slope that is less than 60 mV/decade.

16 Claims, 13 Drawing Sheets

(56) References Cited

U.S. PATENT DOCUMENTS

| | | | |
|---|---|---|---|
| 7,871,877 | B2 | 1/2011 | Griebenow et al. |
| 7,999,326 | B2 | 8/2011 | Wei et al. |
| 8,030,148 | B2 | 10/2011 | Hoentschel et al. |
| 8,035,164 | B2 | 10/2011 | Kato |
| 8,062,952 | B2 | 11/2011 | Hoentschel et al. |
| 8,329,531 | B2 | 12/2012 | Hoentschel et al. |
| 8,772,878 | B2 | 7/2014 | Hoentschel et al. |
| 8,884,379 | B2 | 11/2014 | Kronholz et al. |
| 9,263,582 | B2 | 2/2016 | Kronholz et al. |
| 9,450,073 | B2 | 9/2016 | Wei et al. |
| 2008/0231248 | A1 | 9/2008 | Hung |
| 2009/0014804 | A1 | 1/2009 | Shima |
| 2009/0101986 | A1 | 4/2009 | Kato |
| 2010/0140589 | A1 | 6/2010 | Ionescu |
| 2011/0266927 | A1 | 11/2011 | Liu et al. |
| 2011/0317486 | A1 | 12/2011 | Lu et al. |
| 2012/0019284 | A1 | 1/2012 | Mauder et al. |
| 2016/0126341 | A1 | 5/2016 | Passlack |
| 2017/0040331 | A1 | 2/2017 | Van Houdt et al. |
| 2017/0069738 | A1 | 3/2017 | Avci et al. |
| 2017/0162250 | A1 | 6/2017 | Slesazeck et al. |
| 2017/0162702 | A1 | 6/2017 | Hu |
| 2017/0249983 | A1 | 8/2017 | Park et al. |
| 2017/0345831 | A1 | 11/2017 | Chavan et al. |
| 2018/0277683 | A1 | 9/2018 | Han et al. |
| 2018/0315852 | A1 | 11/2018 | Ozkan et al. |
| 2018/0322912 | A1 | 11/2018 | Duenkel et al. |
| 2018/0323188 | A1 | 11/2018 | Han et al. |

OTHER PUBLICATIONS

Agarwal et al., A Nanoscale Piezoelectric Transformer for Low-Voltage Transistors, ASC Publications, Nono Lett. 2014, 14, 6263-6268.

Transition metal dichalcogenide monolayers, https://en.wikipedia.org/wiki/Transition_metal_dichalcogenide_monolayers#cite_note-FET-3 (last accessed Apr. 19, 2017).

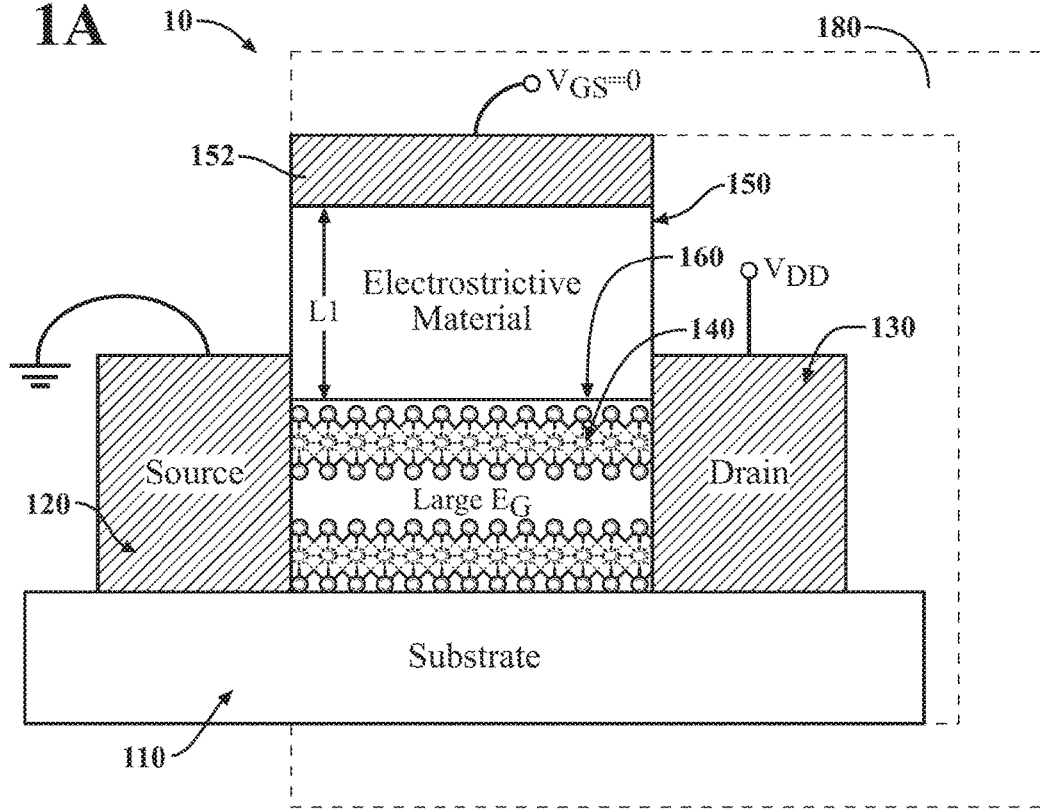

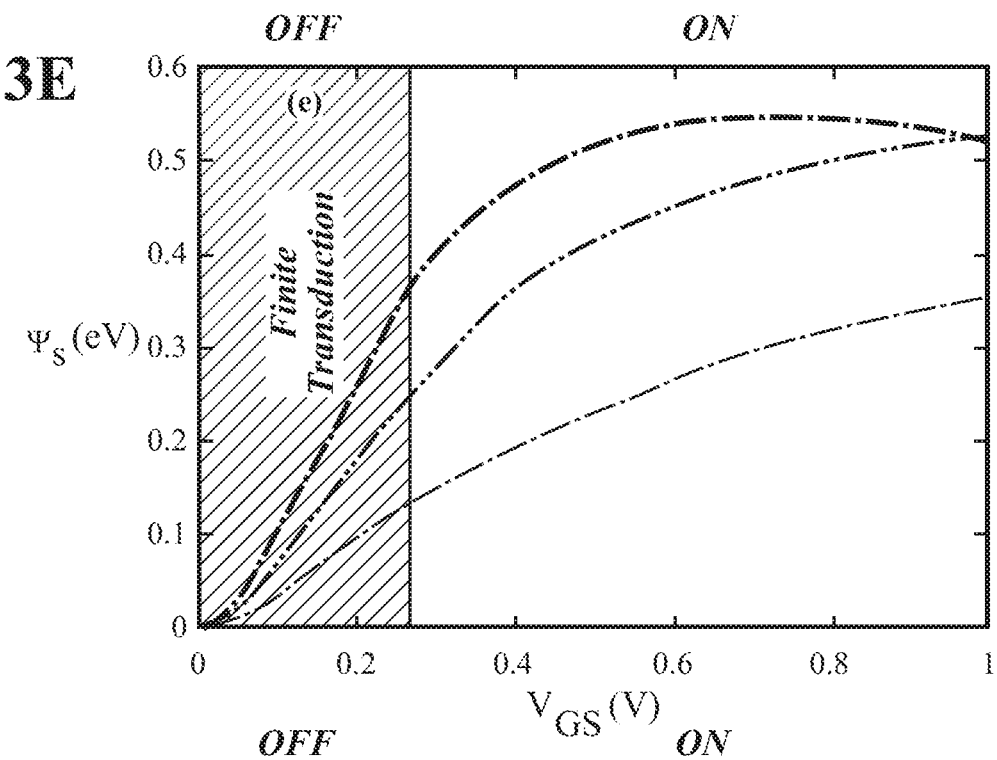
FIG. 3E
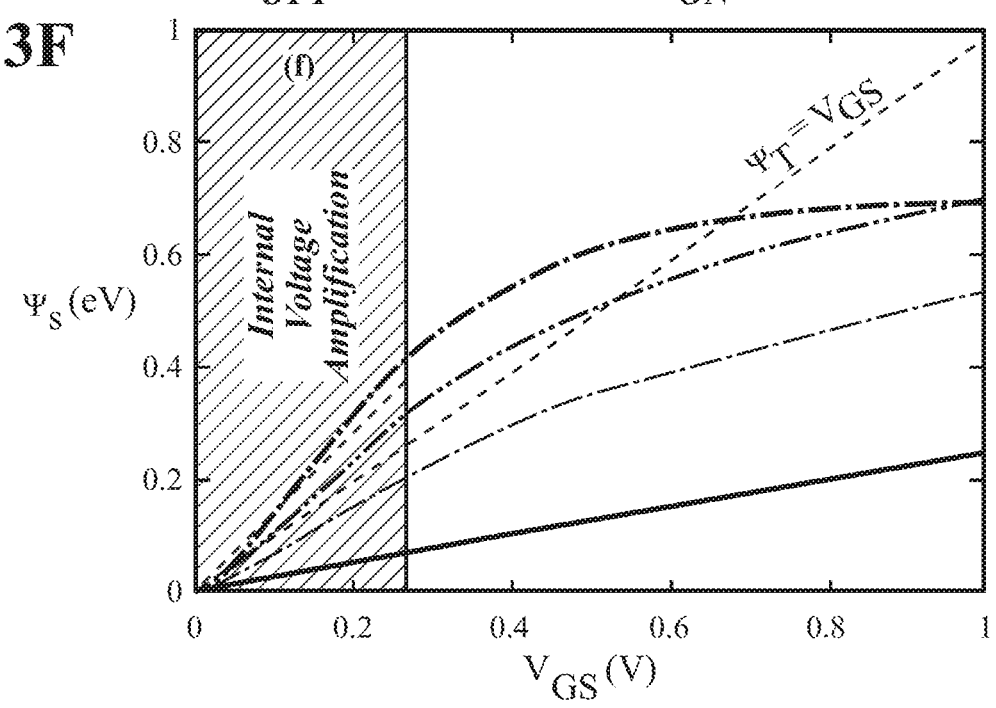
FIG. 3F
FIG. 3G
— γ = 0.0
—·— γ = 0.7
······ γ = 1.5
—··— γ = 2.0

$C_{IT} = 0$ ································
$C_{IT} = C_E$ ─ ─ ─ ─ ─
$C_{IT} = 3C_E$ ──── ·· ······ ···
$C_{IT} = 9C_E$ ───── · ────── × ────── ·· ──────

$V_{DD} = 0.4V$ ─── ── ── ──
$V_{DD} = 0.3V$ ──── ·· ─────── ··· ──
$V_{DD} = 0.2V$ ────── · ────── × ────── × ──────

TWO-DIMENSIONAL ELECTROSTRICTIVE FIELD EFFECT TRANSISTOR (2D-EFET)

CROSS-REFERENCE TO RELATED APPLICATIONS

This application is a continuation of U.S. application Ser. No. 15/945,207, filed Apr. 4, 2018, which claims priority from Provisional Application No. 62/523,520 filed Jun. 22, 2017; the entire content of each application is incorporated herein by reference.

GOVERNMENT SUPPORT

This invention was made with government support under Grant No. ECCS1640020, awarded by National Science Foundation. The Government has certain rights in the invention.

FIELD OF THE INVENTION

The present invention is related to a device and method for manufacturing a two-dimensional electrostrictive field effect transistor having a substrate, a gate, a source, a drain, and a channel disposed between the source and the drain. The channel is a two-dimensional layered material. The gate has a column of an electrostrictive or piezoelectric or ferroelectric material, wherein an electrical input to the gate produces an elongation of the column that applies a force or stress on the channel and reduces the bandgap of the two-dimensional material. The change in the bandgap of the two dimensional material changes its conductivity such that the two-dimensional electrostrictive field effect transistor operates with subthreshold slope which is less than 60 mV/decade.

BACKGROUND OF THE INVENTION

Ever since the inception of metal oxide semiconductor field effect transistor (MOSFET), scaling has been the primary driving force behind its unprecedented success. The early era of scaling (~1975-2005: Dennard Scaling) had two characteristic features. The first feature was dimension scaling which allowed the number of transistors per chip to increase by 1000000× and consequently their speed to increase by 1000×. The second feature was voltage scaling which kept the power density practically constant throughout this scaling regime. However, around 2005, the voltage scaling almost stopped as further reduction in the supply voltage ($V_{DD}$) and hence the threshold voltage ($V_{TH}$) was leading to exponential increase in the OFF state current ($I_{OFF}$). This is a direct consequence of non-scalability of the subthreshold swing (SS) to below 60 mV/decade arising out of the Boltzmann statistics that governs the operation of conventional MOSFETs. Dimension scaling, however, continued beyond 2005, but under the new generalized scaling rules. This inevitably led to increase in the power density at the same rate as the integration density. The actual scenario worsened by the non-scaling factors, which escalated the static and leakage power densities at a much faster rate. Power/heat dissipation, henceforth, became the main problem for the high performance microprocessors. Today, in 2016, even the dimension scaling seems extremely challenging beyond 10 nm gate length ($L_G$) owing to the fundamental material limitations. So it is not too far when all the aspects of MOSFET scaling will completely stop, marking the end of the silicon complementary metal oxide semiconductor (CMOS) era. Therefore, in order to restore the golden era of transistor scaling, energy efficient and high performance, innovative device ideas based on aggressively scalable novel materials need to be conceived on an urgent and immediate basis.

It is obvious from the above discussion that the post-Si-CMOS devices have to resolve two key challenges: length scaling and voltage scaling. For length scaling, low dimensional systems like nanotubes, nanowires and very recently nanosheets are being considered as alternative materials to silicon (Si) due to their inherent electrostatic integrity that allows fundamentally superior scaling properties. Voltage scaling, however, necessitates steep slope devices that in turn require operation beyond Boltzmann statistics. Several steep switching device concepts like tunneling FETs, piezoelectric strain modulated Si FinFETs, negative capacitance ferroelectric FETs, excitonic FETs and spin-based FETs have been proposed. Among these, tunneling FETs are the most matured candidates, which have experimentally demonstrated SS less than 60 mV/decade. However, the greatest challenge for tunneling FETs are their low ON state current densities limited by the large tunneling barriers. Piezoelectric strain modulated Si FinFETs are also promising but suffer from the limitation of the bulk nature of Si at the scaling limits. The readers should note that the objective for post-CMOS device design is mainly two-fold: SS slope should be as abrupt as possible (ideally zero) to meet the low power requirement whereas the ON current should be as high as possible to increase the device's speed. Therefore, it would be desirable to overcome the above-discussed limitations and to provide a better solution.

SUMMARY OF THE INVENTION

Certain embodiments of the present invention provide a disruptive device concept, which meets both low power and high performance criterion for post-CMOS computing and at the same time, enables aggressive channel length scaling. This device, hereafter refer to as a two-dimensional electrostrictive field effect transistor or 2D-EFET, allows a sub-60 mV/decade subthreshold swing and a considerably higher ON current compared to any state of the art FETs. Additionally, by the virtue of its ultra-thin body nature and electrostatic integrity, the 2D-EFET enjoys scaling beyond 10 nm technology node. The 2D-EFET works on the principle of voltage induced strain transduction. It uses an electrostrictive or piezoelectric or ferroelectric material as a gate oxide, which expands in response to an applied gate bias and thereby transduces an out-of-plane stress on the 2D channel material. This stress reduces the inter-layer distance between the consecutive layers of the semiconducting 2D material and dynamically reduces its bandgap to zero i.e. converts it into a semi-metal. Thus, the device operates with a large bandgap in the OFF state and a small or zero bandgap in the ON state. Because of this transduction mechanism, internal voltage amplification takes place which results in a sub-60 mV/decade subthreshold swing (SS).

Certain embodiments of the present invention provide a two-dimensional electrostrictive field effect transistor (2D-EFET) having a substrate, a gate, a source, a drain, and a channel disposed between the source and the drain. The channel is a two-dimensional layered material. The gate has a column of an electrostrictive or piezoelectric or ferroelectric material, wherein an electrical input to the gate produces an elongation of the column that applies a force or mechanical stress on the channel and reduces the bandgap of the two-dimensional material. Some embodiments of the 2D-EFET may further have a capping wherein the substrate, the gate, the source, the drain, and the channel are embedded.

According to some embodiments of the present invention, the consecutive layers of two-dimensional material may include a semiconductor $MX_2$ wherein M is a transition metal atom like Molybdenum (Mo), Tungsten (W) or Tin (Sn) and X is a chalcogen atom of Sulphur (S), Selenium (Se) or Tellurium (Te). Upon application of an electrical input to the gate, the electrostrictive or piezoelectric or ferroelectric column may elongate and thereby transduce a compressive force on the channel. As such the channel transitions from an insulator or large bandgap semiconductor to a metal or smaller bandgap semiconductor. The channel may have a plurality of consecutive layers of the two-dimensional layered material.

According to another embodiment of the present invention, the 2D-EFET may have a capping, a substrate embedded inside the capping, a source embedded inside the capping, a drain embedded inside the capping, and a channel embedded inside the capping between the source and the drain. The channel is a two-dimensional layered material. The consecutive layers of the two-dimensional material may include a semiconductor $MX_2$ wherein M is a transition metal atom like Molybdenum (Mo), Tungsten (W) or Tin (Sn) and X is a chalcogen atom of Sulphur (S), Selenium (Se) or Tellurium (Te). Upon application of an electrical input to the gate, the electrostrictive or piezoelectric or ferroelectric column may elongate and thereby transduce a compressive force on the channel. As such the channel transitions from an insulator or large bandgap semiconductor to a metal or smaller bandgap semiconductor. The channel may have a plurality of consecutive layers of the two-dimensional layered material.

The channel may exhibit an insulator to metal transition or a large bandgap semiconductor to small bandgap semiconductor transition and vice versa in response to the application or removal of electrical voltage to the gate, such that the transistor exhibits a sub-threshold swing of less than 60 mV/decade.

Some embodiments of the two-dimensional electrostrictive field effect transistor according to the present invention may also have a dielectric formed on the gate such that the source, the drain, and the channel are disposed on the dielectric. This embodiment also has a back gate disposed on the substrate and the gate is formed on the back gate.

Yet other embodiments of the 2D-FET according to the present invention may also have another gate with another column of an electrostrictive or piezoelectric or ferroelectric material. The electrical input to the another gate produces an elongation of the another column. The channel has a first surface and a second surface. The column of the gate is configured to apply the force on the first surface of the channel and the another gate is disposed such that the elongation of the another column applies another force on the second surface of the channel and reduces the bandgap of the two-dimensional layered material. Certain embodiments of the present invention provide a method of manufacturing a two-dimensional electrostrictive field effect transistor (2D-EFET) that has the steps of forming a substrate, forming a source, forming a drain, and forming a channel from two or more consecutive layers of two-dimensional material and disposing the channel between the source and the drain. The method also has a step of forming a gate proximate a channel and the gate may comprise a column of an electrostrictive or piezoelectric or ferroelectric material, wherein applying an electrical input to the gate produces an elongation of the column that applies a force on the channel and reduces the bandgap of the two-dimensional channel material. Some embodiments of the method may have the steps of providing a capping, and embedding the substrate, the gate, the source, the drain and the channel on the substrate.

Another embodiment of the method may include steps of forming a dielectric between the gate and the channel and forming a back gate between the substrate and the gate. The column may be disposed between the back gate and the gate.

Yet another embodiment of the method may have additional steps of forming a second gate, wherein the channel is disposed between the gate and the second gate. The second gate has a second column of an electrostrictive or piezoelectric or ferroelectric material. The second gate produces an elongation of the second column that applies a force or mechanical stress on the channel and reduces the bandgap of the two-dimensional layered material.

BRIEF DESCRIPTION OF THE DRAWINGS

The accompanying drawings, which are included to provide a further understanding of the invention and are incorporated in and constitute a part of this application, illustrate embodiment (s) of the invention and together with the description serve to explain the principle of the invention. For simplicity and clarity, the figures of the present disclosure illustrate a general manner of construction of various embodiments. Descriptions and details of well-known features and techniques may be omitted to avoid unnecessarily obscuring the discussion of described embodiments of the present disclosure. It should be understood that the elements of the figures are not necessarily drawn to scale, and that the dimensions of some elements may be exaggerated relative to other elements for enhancing understanding of described embodiments.

In the drawings:

FIG. 1a is a cross-sectional block diagram of a 2D-EFET in an OFF state according to one embodiment of the present invention;

FIG. 1b is a cross-sectional block diagram of a 2D-EFET in an ON state according to one embodiment of the present invention;

FIG. 3e is a channel potential map of electrostrictive component $\Psi_E$ as a function of $V_{GS}$ for $\gamma=0.0$, $\gamma=0.7$, $\gamma=1.5$ and $\gamma=2.0$ and with finite interface traps capacitance $C_{IT}=3C_E$;

FIG. 3f is a channel potential map of total channel potential $\Psi_T$ as a function of $V_{GS}$ for $\gamma=0.0$, $\gamma=0.7$, $\gamma=1.5$ and $\gamma=2.0$ and with finite interface traps capacitance $C_{IT}=3C_E$;

FIG. 3g is a list of line styles corresponding to various values of $\gamma$ in FIGS. 3a-3f and FIGS. 4a-4b;

DETAILED DESCRIPTION OF THE INVENTION

Figure 1C:
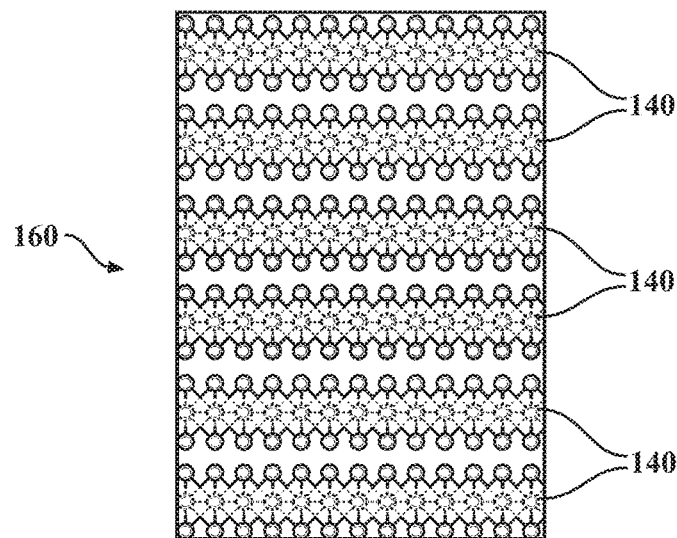
FIG. 1c is a cross-section of a 2D channel with a plurality of cascaded consecutive layers of two-dimensional material.

The present disclosure generally relates to 2D-EFETs that include a channel with bandgap characteristics altered by an application or removal of an electrical input. A two dimensional electrostrictive field effect transistor (2D-EFET) system and method according to the present invention may take a variety of forms. Various examples of the present invention are shown in the Figures. However, the present invention is not limited to the illustrated embodiments. Reference will now be made in detail to some embodiments of the present invention, examples of which are illustrated in the accompanying figures.

Wherever possible, the same reference numbers will be used throughout the drawings to refer to the same or like parts. Additional objects and features of the invention will be set forth in part in the description that follows and in part will become apparent to those having ordinary skill in the art upon examination of the following or may be learned from practice of the invention. The objectives of the invention may be realized and attained by the structure particularly pointed out in the written description and claims hereof as well as the appended figures. It is to be understood that both the foregoing general description and the following detailed description of the present invention are exemplary and explanatory and are intended to provide further explanation of the invention as claimed.

A 2D-EFET consists of a source, a drain, and a channel disposed between the source and the drain. The channel consists of a two-dimensional (2D) material that has a large bandgap in an OFF state. The 2D-EFET also has a high-k insulating gate in the form of a layer of electrostrictive or piezoelectric or ferroelectric material deposited on the channel. When an electrical input is applied to the gate, the electrostrictive or piezoelectric or ferroelectric material expands and transduces an out-of-plane stress on the 2D channel. The out-of-plane stress due to expansion monotonically reduces the channel's bandgap to zero allowing current conduction between the source and the drain, and thus, switching 2D-EFET to an ON state. The 2D-EFET offers a steep subthreshold swing (SS) below 60 mV/decade owing to an internal-feedback mechanism giving rise to voltage amplification and provides significantly higher ON-state current density compared to any existing state of the art charge based device.

Two-dimensional (2D) layered semiconductors have an ultra-thin body that allows aggressive channel length scaling and hence high performance. The bandgap of multilayer Transition Metal Dichalcogenides (TMDs: a class of 2D materials) like $MoS_2$, $WSe_2$ etc. can be dynamically reduced to zero by applying an out-of-plane stress. In embodiments of the present invention, the scalability of the 2D materials is combined with the stress induced dynamic bandgap engineering to form a device referred to herein as a Two Dimensional Electrostrictive Field Effect Transistor or 2D-EFET.

Now, an embodiment of 2D-EFET is discussed in detail with reference to particular Figures. FIG. 1a is a cross-sectional block diagram of one embodiment of a Two-Dimensional Electrostrictive Field Effect Transistor, or 2D-EFET 10, in the OFF state, whereas FIG. 1b is a cross-sectional block diagram of a 2D-EFET 10 in an ON state. As shown, the 2D-EFET 10 includes a source 120, a drain 130, and a channel 160. Channel 160 has a large bandgap $E_G$ in the OFF state. Channel 160 may be formed by transition metal dichalcogenide (TMD) two dimensional layers 140 that are bound to each other by van der Waals (vdW) attraction. In some embodiments, the two-dimensional material 140 may consist of a semiconductor $MX_2$, wherein M is a transition metal atom like Molybdenum (Mo), Tungsten (W) or Tin (Sn) and X is a chalcogen atom of Sulphur (S), Selenium (Se) or Tellurium (Te). As shown, the 2D-EFET 10 also consists of a substrate 110 and gate 150. Source 120, drain 130, and channel 160 are disposed on the substrate 110.

Gate 150 includes a column of electrostrictive material that is deposited on channel 160. The gate includes a contact or upper element 152. In the OFF state, the 2D-EFET operates with a large bandgap and prevents current conduction between the source 120 and drain 130 whereas in an ON state, it operates with a smaller or zero bandgap and allows current conduction. In the OFF state, the electrostrictive material behaves like a high-k insulating gate oxide but undergoes a longitudinal expansion when an electric field is applied across it. Electrostrictive materials exhibit a dimensional change upon application of an electric field due to the energy increase associated with the polarization induced by the electric field in the material. In other words, this is a form of elastic deformation of an electrostrictive material induced by an electric field. This dimensional change transduces an out-of-plane stress on the 2D channel material and monotonically reduces its bandgap to zero. Note that the electrostrictive material of gate 150 has a length L1 when the $V_{GS}$ (Voltage Gate to Source) is zero. As shown in FIG. 1$b$, when $V_{GS}=V_{DD}$ is applied, the electrostrictive material of gate 150 exhibits a dimensional change to length L2, which is greater than length L1. The stress produced by the expansion of electrostrictive material 150 from L1 to L2 is transferred to channel 160 resulting in its compression. This compression brings the consecutive layers 140 of channel 160 closer and reduces the bandgap $E_G$. Reduced bandgap $E_G$ allows current conduction between source 120 and drain 130, and the 2D-EFET switches to its ON state. Moreover, due to the reduced bandgap $E_G$, the 2D-EFET offers a steep subthreshold swing (SS) below 60 mV/decade owing to an internal-feedback mechanism giving rise to voltage amplification and provides a significantly higher ON-state current density compared to any existing charge based device.

The amount of deformation of the electrostrictive material, i.e. L2 minus L1, may vary depending on the composition of the electrostrictive material and/or the gate electrical input $V_{GS}$. In some embodiments, the amount of elongation of the electrostrictive material is such that the channel 160 with a large bandgap (as shown in FIG. 1$a$) transitions into channel 160 that has a small bandgap (as shown in FIG. 1$b$). In other embodiments, the amount of elongation of the electrostrictive material is such that the bandgap of the channel 160 substantially reduces to zero and thereby exhibit characteristics of a metal in the ON state. As shown in FIG. 1$c$, channel 160 of some embodiments of the present disclosure may have a plurality of cascaded consecutive layers 140 of the two-dimensional material in 2D-EFET 10.

The operation of a 2D-EFET is explained below with reference to FIGS. 2$a$-2$d$ and equations 1 through 8. FIG. 2$a$ is a graphical representation of strain (S) versus electric field ($\xi$) characteristics (equation 1) of an electrostrictive material and FIG. 2$b$ is a graphical representation of bandgap ($E_G$) versus out-of-plane stress (P) characteristics (equation 2) of a 2D material based on the phenomenological models.

$$S = \lambda \xi \quad (1)$$

$$E_G = E_{G0} - \alpha P \quad (2)$$

The parameter sets are specific to the choice of electrostrictive and 2D material. The linear approximation of equations 1 and 2 as shown in FIGS. 2$a$ and 2$b$ are used for the discussion below. In a 2D-EFET, equations 1 and 2 are coupled through equation 3, where, $t_E$ is the thickness of the electrostrictive material, $Y_{2D}$ and $t_{2D}$ are, respectively, the Young's modulus and thickness of the 2D material, and finally, $\eta$ quantifies a ratio of strain transfer from the electrostrictive material 150 to the channel material 160 such that $\Delta t_{2D} = \eta \cdot \Delta t_E$ ($0 < \eta < 1$).

$$P = Y_{2D} \eta \frac{t_E}{t_{2D}} S \approx \sigma \xi \quad (3)$$

Note that the $\eta$ parameter for the 2D-EFET determines the efficiency of strain transduction and hence improvement in the subthreshold swings (SS). There are several ways to integrate an electrostrictive material 150 with the 2D materials for maximum strain transfer. One possible strategy would be capping/encapsulating the entire device structure in a rigid fixture to minimize the expansion of the electrostrictive material 150 away from the 2D channel 160. A constraining structure is represented at 180, though the device may be constrained in other ways. In one example, element 180 may represent a capping and the substrate, channel, gate, source and drain may be embedded in the capping. It is also noted that actual devices in accordance with the present invention would be very small and that FIGS. 1$a$ and 1$b$ may not be representative of the relative dimensions of the elements.

Another possible approach is to engineer an electrostrictive material which can provide higher strain than lead magnesium niobate-lead titanate (PMN-PT) and thereby compensate for the coupling efficiency. Various doping and alloying routes have developed new lead-free ceramics, such as titanates, alkaline niobates and bismuth perovskites and their solid solutions. Specifically, a significant electric field-induced strain (EFIS) was observed in an Nb-modified lead-free $Bi_{0.5}Na_{0.5}TiO_3$—$Bi_{0.5}K_{0.5}TiO_3$—$LiTaO_3$ (BNT-BKT-LT) ternary system. With 3 mol % Nb substitution, the EFIS could be enhanced up to 641 pm/V. A Lead-free Zr-modified $Bi_{0.5}(Na_{078}K_{0.22})_{0.5}TiO_3$ ceramic (BNKTZ-100x, with x=0-0.05) also demonstrates an enhanced unipolar field-induced strain of around 0.43%.

FIG. 2$c$ is a cross-sectional block diagram of a 2D-EFET and its equivalent capacitive network model, where $V_{GS}$ is the applied external gate bias, $\Psi_S$ is the electrostatic surface potential, and $C_E$, $C_{CH}$ and $C_{IT}$ are respectively the capacitances associated with the electrostrictive material, the 2D channel material and the interface traps. FIG. 2$d$ is a schematic showing the position of the energy bands inside the 2D channel material corresponding to the OFF and ON state of the device during its operation. In FIG. 2$d$, $\Psi_S$ is the usual electrostatic component, whereas $\Psi_E$ is the electrostrictive component. The electrostrictive component $\Psi_E$ arises due to a reduction in the bandgap of the 2D material 160 in response to the out-of-plane stress transduced by the electrostrictive material 150. This gives rise to internal voltage amplification, which is responsible for a steep subthreshold swing (SS) that is less than 60 mV/decade in 2D-EFETs. Note that the additional band movement $\Psi_E$ appears due to the decrease in the bandgap of the channel material 160 through an electrostrictive transduction.

Theoretical simulations performed on the bilayer TMDs by Kumar et al. suggest that the conduction band (CB) minima between the K-Γ high symmetry point and the valence band (VB) maxima at the Γ point in the Brillouin zone of various TMDs move toward their corresponding Fermi levels when the inter-layer spacing between the successive Van der Waals layers are monotonically reduced. It is also apparent from the calculations that the rate of movements of the conduction band (CB) minima and valence band (VB) maxima as a function of the inter-layer spacing are almost similar, which justifies the assumption $\Psi_E=1/2\ \Delta E_G$. Note that the total channel potential ($\Psi_T=\Psi_S+T_E$) is always greater than $\Psi_S$ and results in an internal voltage amplification. FIGS. 3a-3f are channel potential maps of the electrostatic potential ($\Psi_S$), electrostrictive potential ($\Psi_E$) and the total channel potential ($\Psi_T$) as a function of the external gate bias ($V_{GS}$) obtained by solving equations 4 through 6 self-consistently with equation 7.

$$\Psi_S = \frac{C_E}{C_E + C_{IT} + C_{CH}} qV_{GS} = rqV_{GS}; r \leq 1 \quad (4)$$

$$\xi = \frac{qV_{GS} - \Psi_S}{t_E} = (1-r)\frac{qV_{GS}}{t_E} \quad (5)$$

$$\Psi_E = \quad (6)$$
$$\frac{\Delta E_G}{2} = \frac{\kappa}{2}\left[\sigma(1-r)\frac{qV_{GS}}{t_E}\right] - \frac{\chi}{2}\left[\sigma(1-r)\frac{qV_{GS}}{t_E}\right]^2 \approx \gamma(1-r)qV_{GS};$$
$$\gamma = \sigma\frac{\kappa}{2t_E};$$

$$C_{CH} = q^2 \frac{\partial}{\partial(\Psi_S + \Psi_E)} \int D(E) \frac{f_S(E) + f_D(E)}{2} dE; D(E) = \frac{4\pi m^*}{h^2}; \quad (7)$$

Note that $C_{CH}$ enters into the expression for $\Psi_S$ and $\Psi_T$ through the quantity r. In equation 7, D(E) denotes the 2D density of states derived from the parabolic energy dispersion relationship, m* is the carrier effective mass, h is the Planck's constant, and $f_S(E)$ and $f_D(E)$ are the Fermi function for the source and drain contact electrodes, respectively. Finally, equation 8 represents the subthreshold swing (SS), wherein $k_B$ is the Boltzmann constant, q is the electronic charge, and T is the temperature.

$$SS = \left(\frac{\partial \log I_{DS}}{\partial V_{GS}}\right)^{-1} = \quad (8)$$
$$\left(\frac{\partial \log I_{DS}}{\partial \Psi_T}\frac{\partial \Psi_T}{\partial V_{GS}}\right)^{-1} = \frac{\frac{k_B T}{q}\ln 10}{\frac{\partial \Psi_T}{\partial V_{GS}}} = \frac{60\ mV/dec}{\frac{\partial \Psi_T}{\partial V_{GS}}} \approx \frac{60\ mV/dec}{1 + \eta\beta d_{33}}$$

Figure 3A:
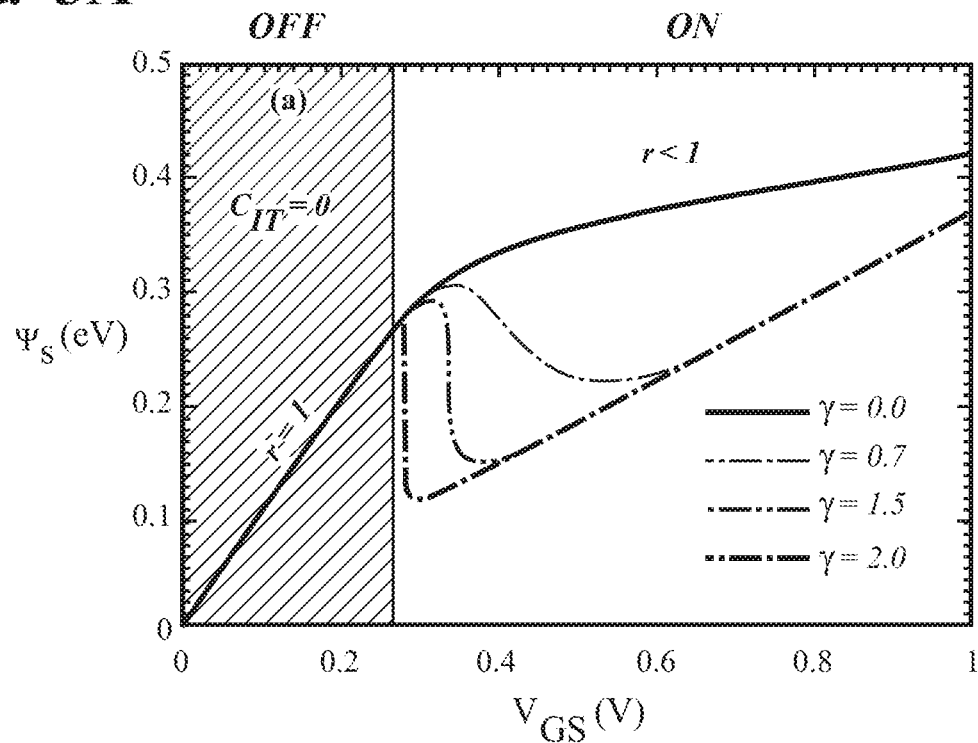
FIG. 3a is a channel potential map of electrostatic component ($\Psi_S$) as a function of applied gate bias ($V_{GS}$) for $\gamma=0.0$, $\gamma=0.7$, $\gamma=1.5$ and $\gamma=2.0$ with interface traps capacitance $C_{IT}=0$.
Figure 3B:
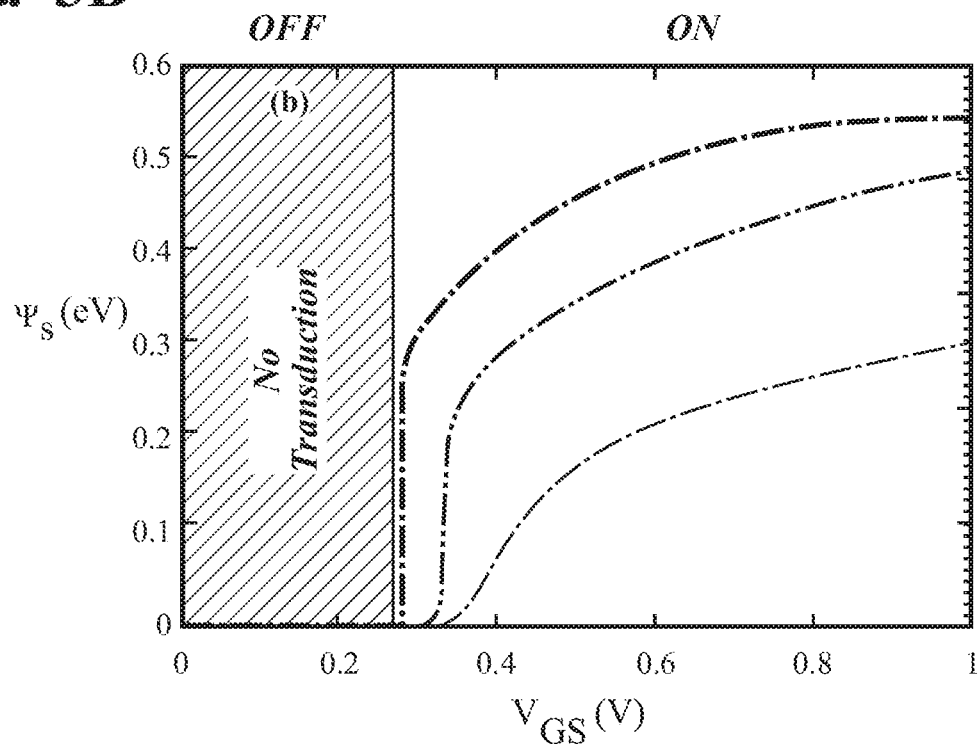
FIG. 3b is a channel potential map of electrostrictive component ($\Psi_E$) as a function of applied gate bias ($V_{GS}$) for $\gamma=0.0$, $\gamma=0.7$, $\gamma=1.5$ and $\gamma=2.0$ with interface traps capacitance $C_{IT}=0$.

As evident from equation 8, in order to obtain a sub-60 mV/decade subthreshold swing (SS), it is necessary to make $\partial\Psi_T/\partial V_{GS}>1$ in the OFF state of the device operation. This is only possible if the quantity r<1, which could be achieved through a finite value of $C_{CH}$ or $C_{IT}$ or both. In a conventional 2D-FET (where $\gamma=0$ and, therefore, $\Psi_E=0$ and $\Psi_T=\Psi_S$), $C_{CH}$ is negligible in the OFF state since D(E)≈0 and $C_{IT}$ should ideally be negligible so that r=1 (i.e. $\Psi_S=V_{GS}$, in equation 4) and hence the subthreshold swing (SS)=60 mV/decade. This is the best possible subthreshold swing (SS) achievable within the Boltzmann limit. In 2D-FETs, r<1 leads to the subthreshold swing (SS)>60 mV/decade, which is undesirable. However, this scenario is completely different for the proposed 2D-EFET, since r=1 results in $\xi=0$ and hence $\Psi_E=0$. Therefore, no transduction leading to internal voltage amplification can occur. As shown in FIG. 3a, if $C_{IT}=0$, the electrostatic band movement is almost one to one with the applied gate bias in the OFF state of the device ($V_{GS}<V_{FB}-v_{TB}$, where, $V_{FB}$ is the flat band voltage and $v_{TB}$ denotes the thermal broadening; $v_{TB}=6$ $k_B T$. $V_{FB}=0.4V$ was used for simulations). This is true irrespective of the value of γ. However, as the device enters near threshold or ON state operation, $C_{CH}$ becomes finite, leading to r<1 and $\Psi_E>0$ as shown in FIGS. 3a and 3b respectively. This initiates an internal feedback mechanism which requires a readjustment of $\Psi_S$ since $C_{CH}$ depend on both electrostatic and electrostrictive potential (equation 7). Hence, $\Psi_S$ becomes non-monotonic in the ON state of device operation as shown in FIG. 3a. Note that higher values of γ are associated with more efficient strain transduction and hence stronger and more abrupt feedback mechanism.

Figure 3C:
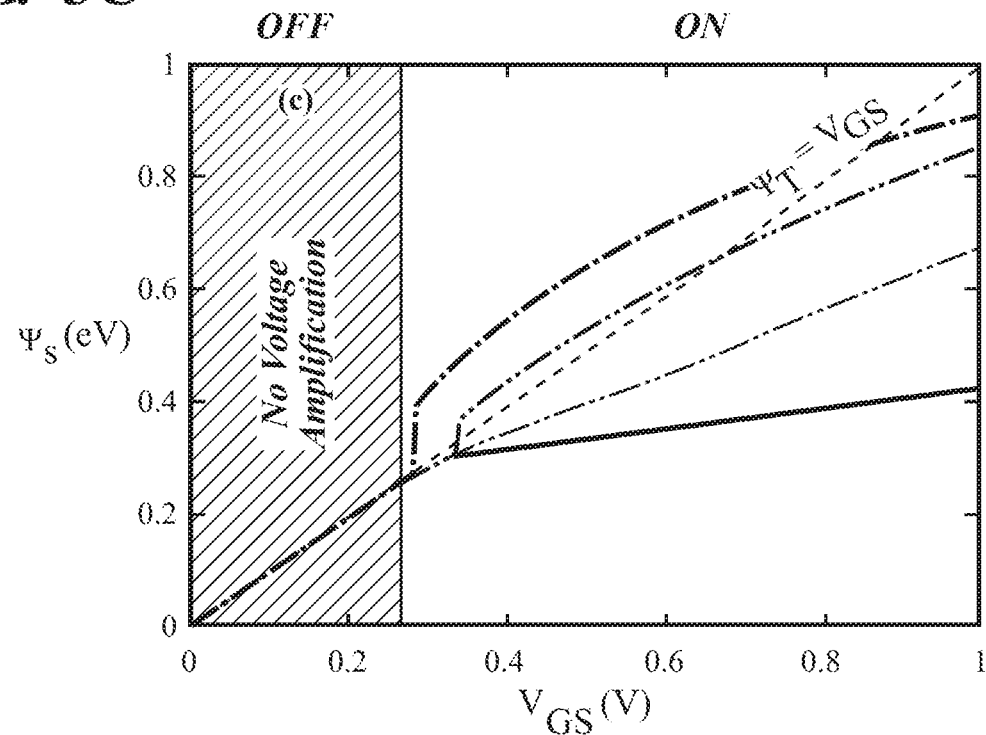
FIG. 3c is a channel potential map of total channel potential ($\Psi_T$) as a function of applied gate bias ($V_{GS}$) for $\gamma=0.0$, $\gamma=0.7$, $\gamma=1.5$ and $\gamma=2.0$ with interface traps capacitance $C_{IT}=0$.

Now referring to FIG. 3(c), the electrostatic band movement is one to one (r=1) with $V_{GS}$ in the subthreshold regime (OFF state) of the device operation and as such no electrostrictive transduction occurs. However, as the device enters near the threshold or ON state operation, the feedback mechanism begins between the electrostatic and electrostrictive potentials since r<1 owing to the finite channel capacitance ($C_{CH}$). This leads to an internal voltage amplification ($\Psi_T>V_{GS}$) in the ON state, wherein the dotted line represents $\Psi_T=V_{GS}$. However, this amplification is not conducive for the sub-60 mV/decade subthreshold swing (SS). The total channel potential $\Psi_T$, however, increases monotonically according to FIG. 3c. However, none of these scenarios are conducive for achieving the sub-60 mV/decade subthreshold swing (SS) since the internal voltage amplification ($\Psi_T>\Psi_S$) takes place only in the ON state of the device operation.

Figure 3D:
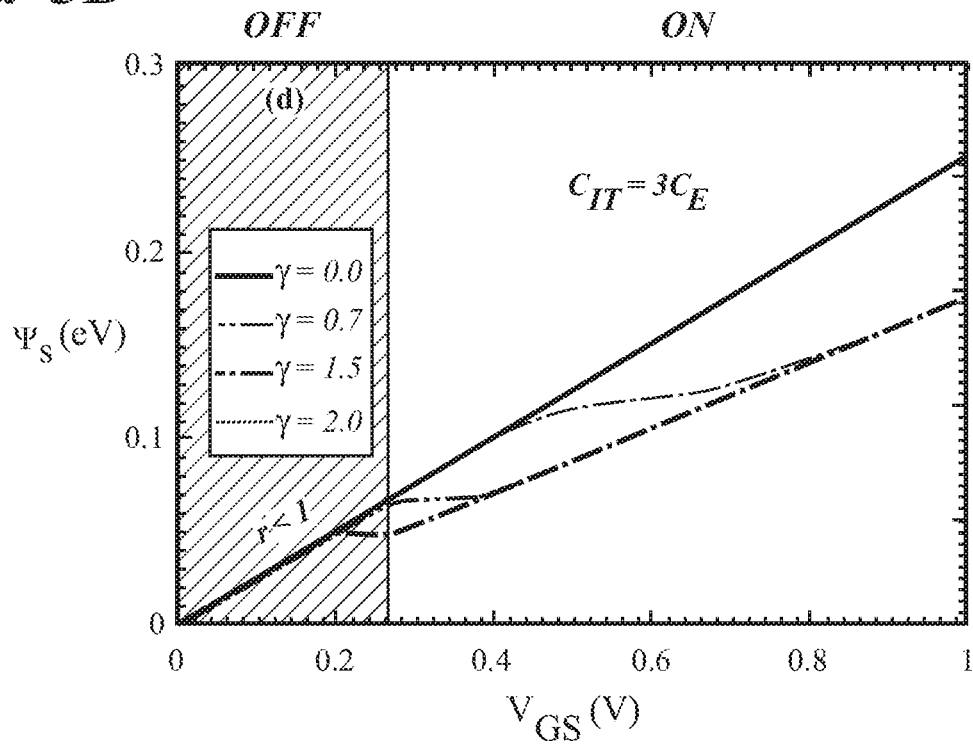
FIG. 3d is a channel potential map of electrostatic component $\Psi_S$ as a function of $V_{GS}$ for $\gamma=0.0$, $\gamma=0.7$, $\gamma=1.5$ and $\gamma=2.0$ and with finite interface traps capacitance $C_{IT}=3C_E$.

As shown in FIGS. 3d-3f, more favorable conditions can be achieved when $C_{IT}$ is finite. In these instances, electrostrictive transduction takes place even in the OFF state. However, the internal voltage amplification only occurs with γ=1.5 (long dash dot dot line) and γ=2.0 (long dash dot line). The material parameters used for these self-consistent simulations are as follows: $\alpha$=8e-5 (cm/kV)$^2$, $\beta$=20, $\delta$=3.5 (cm/kV)$^{1.5}$, $E_{G0}$=1.6 eV, $\kappa$=70 meV/GPa, $\chi$=1.2 meV/(GPa)$^2$, $Y_{2D}$=300 GPa, $t_{2D}$=1 nm, $t_E$=100 nm, m*=0.45 $m_0$. The values of η(0<η<1) were adjusted to obtain the different γ values. This allows r<1 and hence $\Psi_E>0$ in the OFF state of the device operation which ultimately leads to the internal voltage amplification ($\Psi_T>\Psi_S$). However, the criterion for the sub-60 mV/decade subthreshold swing (SS) i.e. $\partial\Psi_T/\partial V_{GS}>1$ is achieved only when γ>1 and r<1 as obvious from equation 9.

Figure 4A:
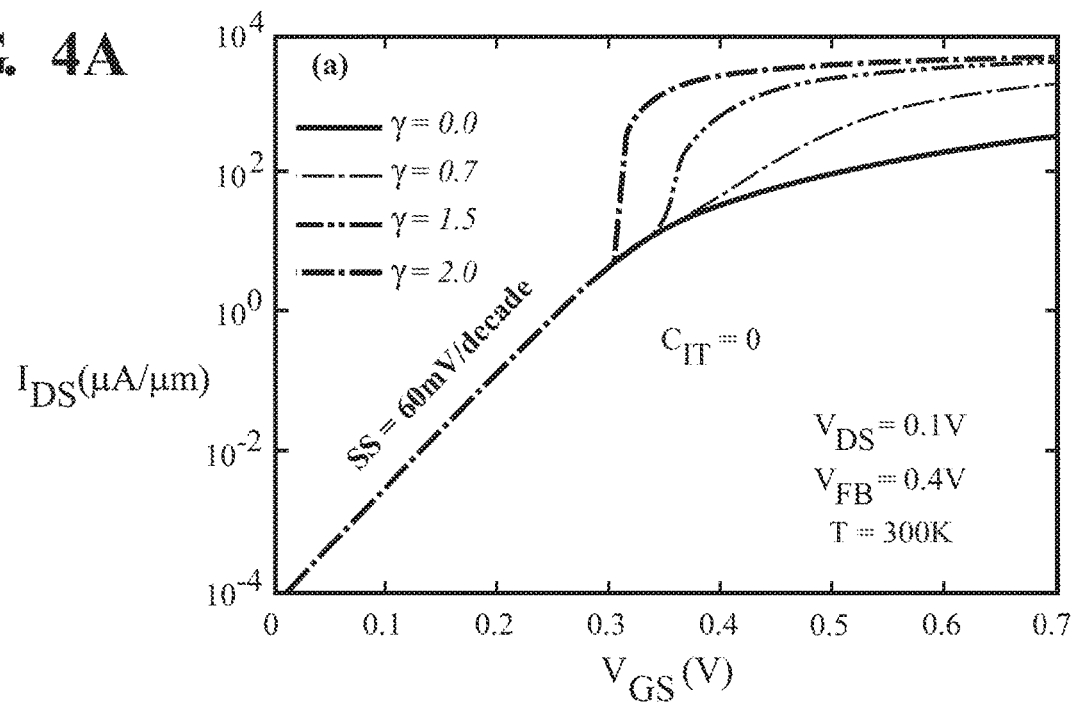
FIG. 4a is a graphical representation of room temperature current ($I_{DS}$) versus gate voltage ($V_{GS}$) characteristics of a 2D-EFET for $\gamma=0.0$, $\gamma=0.7$, $\gamma=1.5$ and $\gamma=2.0$ with interface traps capacitance $C_{IT}=0$.
Figure 4B:
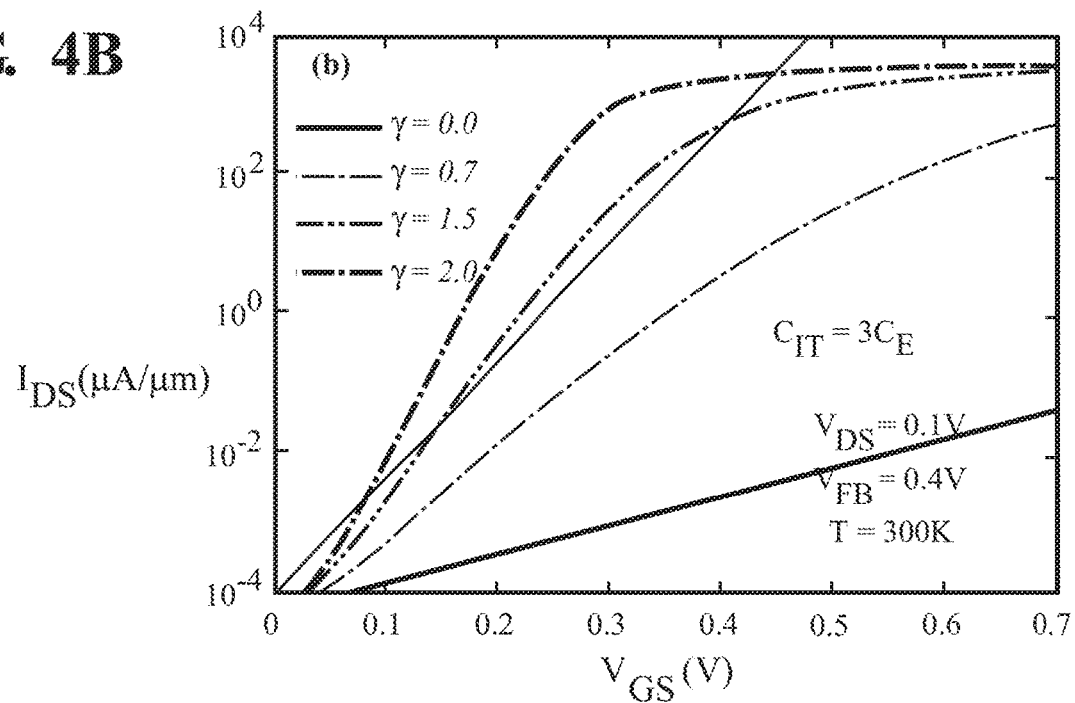
FIG. 4b is a graphical representation of room temperature current ($I_{DS}$) versus gate voltage ($V_{GS}$) characteristics of a 2D-EFET for $\gamma=0.0$, $\gamma=0.7$, $\gamma=1.5$ and $\gamma=2.0$ with interface traps capacitance $C_{IT}=3C_E$.

FIG. 4a is a graphical representation of room temperature current ($I_{DS}$) versus gate voltage ($V_{GS}$) characteristics of the 2D-EFET for γ=0.0, γ=0.7, γ=1.5 and γ=2.0 with $C_{IT}$=0. The η values used to obtain the corresponding γ values are 0.0, 0.2, 0.4, and 0.6, respectively. Moreover, the source to drain bias of $V_{DS}$=0.1V and the flat band voltage of $V_{FB}$=0.4V was used. Next, FIG. 4b is a graphical representation of room temperature current ($I_{DS}$) versus gate voltage ($V_{GS}$) characteristics of the 2D-EFET for γ=0.0, γ=0.7, γ=1.5 and γ=2.0 with $C_{IT}$=3$C_E$. The η values used to obtain the corresponding γ values are 0.0, 0.2, 0.4, and 0.6, respectively. Here again, the source to drain bias of $V_{DS}$=0.1V and the flat band voltage of $V_{FB}$=0.4V was used.

FIGS. 4a and 4b show the transfer characteristics of the 2D-EFET obtained by solving equations 4 through 7 self consistently with the ballistic Landauer formalism (equation 9).

$$I_{DS} = I_1 - I_2; \quad (9)$$

-continued $$I_1 = \frac{q}{\pi} \int_{qV_{FB}-\Psi_T}^{\infty} D(E)v(E)f(E)dE;$$

$$I_2 = \frac{q}{\pi} \int_{qV_{FB}-\Psi_T+qV_{DD}}^{\infty} D(E)v(E)f(E)dE$$

Figure 4C:
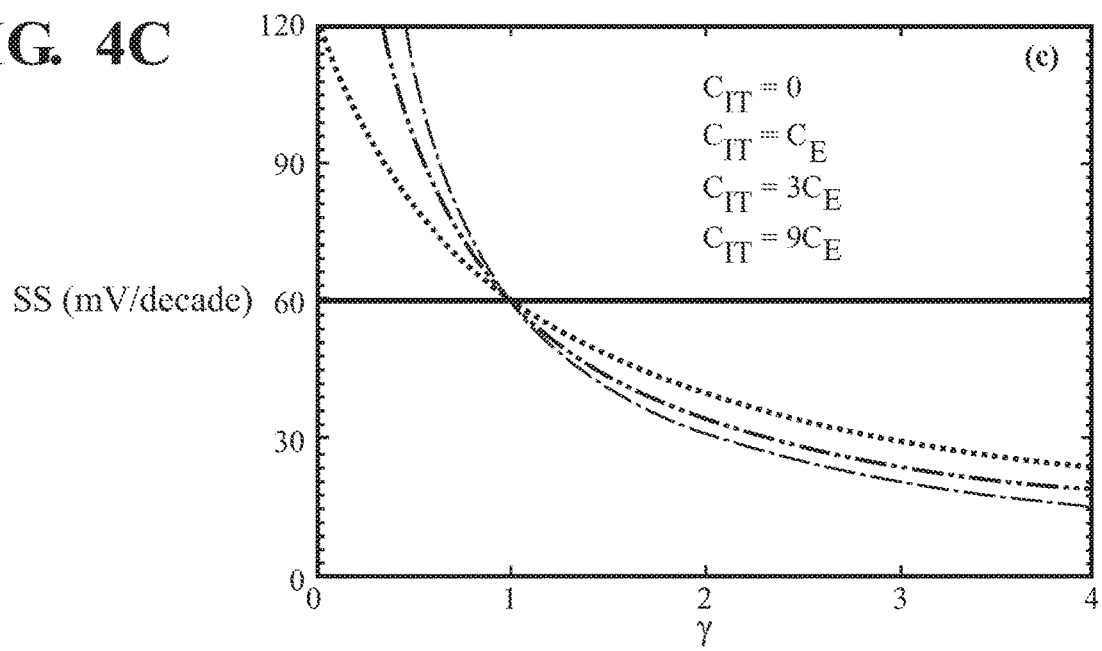
FIG. 4c is a graphical representation of subthreshold swing (SS) as a function of $\gamma$ for different values of interface traps capacitance $C_{IT}$.

In equation 9, $I_1$ and $I_2$ are the current due to electron injection from the drain and the source contacts, respectively and v(E) is the carrier velocity. As expected, the sub-60 mV/decade subthreshold swing (SS) is achieved for the finite value of $C_{IT}$ and $\gamma>1$. FIG. 4c shows an average subthreshold swing (SS) (over 4 decades) as a function of $\gamma$ for different values of $C_{IT}$. It should be noted that the sub-60 mV/decade subthreshold swing (SS) is obtained if and only if $C_{IT}>0$ and $\gamma>1$. It is counter intuitive from a conventional 2D-FET standpoint to note that the higher values of $C_{IT}$ allow better subthreshold slopes in the 2D-EFET for a given value of $\gamma$. However, the reader should realize that although finite $C_{IT}$ is detrimental for the electrostatic band movement, it is beneficial for the electrostrictive band movement. This is because larger $C_{IT}$ ensures larger potential drop across the electrostrictive gate material, which culminates into higher stress and greater bandgap reduction in the 2D channel material. In principle, if we make r=0 corresponding to an infinitely large $C_{IT}$, then $\Psi_S=0$, which completely stops the electrostatic band movement in the channel. However, $\Psi_E$ will still be finite due to the electrostrictive band movement. As long as $\Delta\Psi_E>\Delta V_{GS}$, an internal voltage amplification will occur leading to the subthreshold swing (SS)<60 mV/decade. Note that the improvement in the subthreshold swing (SS) in the 2D-EFET is essentially determined through the quantity $\gamma$ that includes several material parameters corresponding to both the 2D material and the electrostrictive material. A larger overall value for $\gamma$ will ensure a better subthreshold swing (SS) as evident from equation 8. A thicker channel material will certainly make $\gamma$ small in accordance with equation 6, whereas the monolayer materials obviously lack Van der Waals spacing. Bilayer materials are optimum for the 2D-EFET since these are the thinnest with a finite Van der Waals spacing. In the present disclosure, the material parameters corresponding to $MoS_2$ are used since it has been most extensively studied in the experiments. Other TMDs also demonstrate similar effects. In fact, as shown by Kumar et al., similar bandgap changes can be obtained at the smaller strain values for $MoSe_2$ and $MoTe_2$ i.e. these materials offer larger $\kappa$ values and hence larger $\gamma$.

Figure 4D:
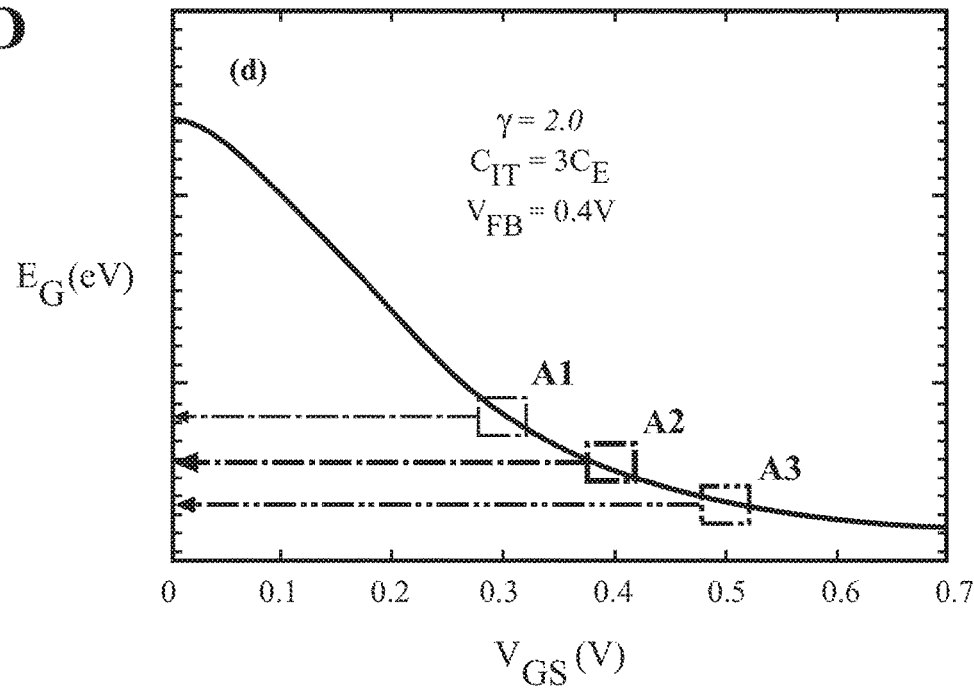
FIG. 4d is a graphical representation of bandgap $E_G$ verses applied gate bias $V_{GS}$ showing a dynamic bandgap change in the channel of a 2D-EFET due to electrostrictive transduction for $\gamma=2$, $C_{IT}=3C_E$ and $V_{FB}=0.4V$.
Figure 4E:
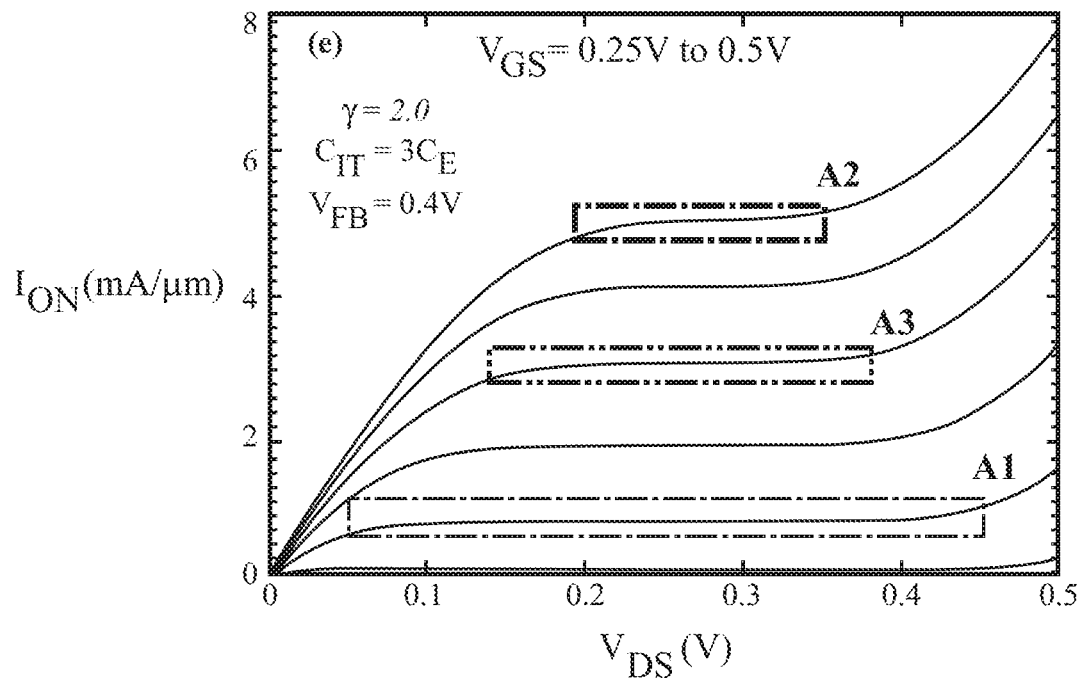
FIG. 4e is a graphical representation of room temperature output characteristics ($I_{DS}$ versus $V_{DS}$) for a 2D-EFET for different values of $V_{GS}$.
Figure 4F:
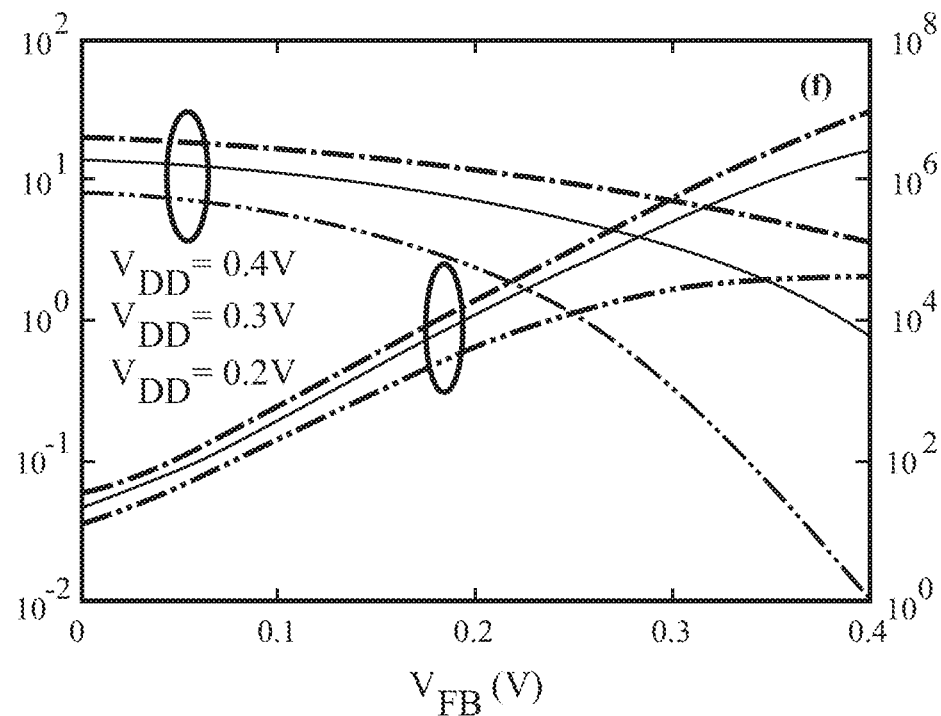
FIG. 4f is a graphical representation of ON current ($I_{ON}$) and ON to OFF current ratio ($I_{ON}/I_{OFF}$) as a function of flat band voltage ($V_{FB}$) for different supply voltages ($V_{DS}=V_{GS}=V_{DD}$)
Figures 4G, 4H, 5:
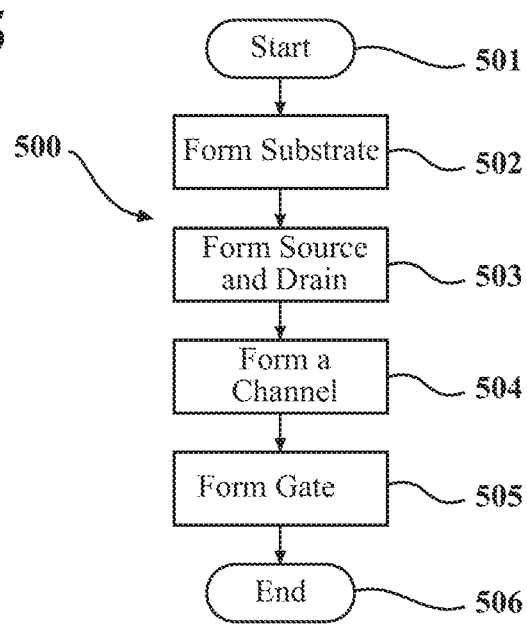
FIG. 4g is a list of line styles corresponding to various values of interface traps capacitance $C_{IT}$ in FIG. 4c.
FIG. 4h is a list of line styles corresponding to various values of $V_{DD}$ in FIG. 4f.
FIG. 5 is a flow diagram depicting example operations that may be performed in accordance with a method of producing a 2D-EFET consistent with the present disclosure.

FIG. 4d shows the dynamic bandgap change as a function of the applied gate bias and FIG. 4e shows the output characteristics for the 2D-EFET with $\gamma=2.0$ and $C_{IT}=3C_E$. It should be noted that FIG. 4g is a list of line styles corresponding to various values of $C_{IT}$ in FIG. 4c, whereas FIG. 4h is a list of line styles corresponding to various values of $V_{DD}$ in FIG. 4f. The rectangular boxes in FIGS. 4d and 4e correlate the length of the saturation region with the dynamic bandgap of the 2D-EFET. Furthermore, the length of the plateau in the output characteristics which is referred to as the saturation regime is equal to the bandgap of the channel material (at T=0K and shortened by few $k_BT$ due to the thermal broadening at finite T) for a ballistic transistor. Since the bandgap changes in the 2D-EFET as a function of the applied gate bias, the length of the saturation region also changes accordingly in FIG. 4e. FIG. 4f shows the ON current ($I_{ON}$) and ON to OFF current ratio ($I_{ON}/I_{OFF}$) for the 2D-EFET as a function of the flat band voltage ($V_{FB}$) for different supply voltages ($V_{DD}$). Ballistic Landauer formalism was used to compute the current versus voltage characteristics. As expected $I_{ON}$ increases with the increase in $V_{DD}$ but decreases with the increase in $V_{FB}$, whereas $I_{OFF}$ remains practically constant with $V_{DD}$ and decreases exponentially with the increase in $V_{FB}$ resulting in the trends observed in FIG. 4f. Clearly, the standard requirement for the high performance FETs (i.e. $I_{ON}=1$ mA/μm and $I_{ON}/I_{OFF}=10^4$) can be achieved by the 2D-EFET for $V_{DD}=0.2V$ that is 3 times smaller than the predicted $V_{DD}=0.6V$ for the year 2020 by International Technology Roadmap for Semiconductors (ITRS).

Moreover, ON current as high as 10 mA/μm can be delivered by the 2D-EFET for a supply voltage of $V_{DD}=0.4V$. Since mechanical motions are slow and limited by the acoustic velocities, it might interfere with the achievable operating speed in the 2D-EFET. However, a simple back of the envelope calculation (conservative) with $t_E=100$ nm and $v_e$=speed of sound in solid=1000 m/s results in ~100 GHz operating speed. One obvious way to increase the speed would be the scaling of the thickness of the electrostrictive material ($t_E$), however, this may lead to reduction in strain transfer and hence increase in the subthreshold swing (SS). Optimization and/or balancing of these factors are needed for achieving for a steep subthreshold swing (SS) that is less than 60 mV/decade in the 2D-EFET. Finally, the channel length ($L_G$) scalability of the 2D-EFET is determined through the band bending length $\lambda$ (equation 10), which is derived by solving 2D Poisson's equation similar to the conventional planar FETs. Therefore, from a pure electrostatic point of view, the use of ultra-thin 2D channels ($t_{2D}=1$ nm, $\varepsilon_{2D}=8$), with an ultra-high-k dielectric ($t_E=100$ nm, $\varepsilon_E=2000$) allows scalability ($L_G>3\lambda=1.8$ nm) well beyond the 10 nm technology node.

$$\lambda=\sqrt{t_{2D}t_E\varepsilon_{2D}/\varepsilon_E} \qquad (10)$$

Another aspect of the present disclosure relates to a method of forming 2D-EFETs consistent with the present disclosure. In this regard, reference is made to FIG. 5, which is a flow diagram of example operations that may be performed in connection with a method of making a 2D-EFET consistent with the present disclosure. It should be understood that the method steps shown are illustrated in a particular order for the sake of clarity, but that in practice they may be performed in any order depending on the geometry and configuration of the 2D-EFET being formed.

As shown in the FIG. 5, method 500 begins at the block 501. At block 502, a substrate is provided or formed, and at block 503 a source and a drain may be formed on a substrate, which may be made of metal or another suitable material. The formation of the source may be performed using any suitable semiconductor manufacturing technique, including various forms of deposition (e.g. thermal evaporation, electron beam evaporation, sputtering, chemical vapor deposition, physical vapor deposition, atomic layer deposition, electrodeposition, electroless deposition, etc.), as may be known in the art. At block 504, a channel may be formed between the source and the drain. Formation of the channel may involve depositing or otherwise forming layers of a two-dimensional material. Alternatively, a prefabricated channel may be deposited between the source and the drain using any suitable semiconductor manufacturing process. Some embodiments may have a plurality of consecutive layers of the two-dimensional material. FIG. 1c shows an example of the two-dimensional material with a plurality of consecutive layers. The nature and manner of forming additional layers of the two-dimensional material is the same as discussed above, and for the sake of brevity will not be reiterated.

In some embodiments, depositing or growing suitable semiconductor materials using any suitable semiconductor manufacturing process may form the source 120 and the drain 130. Such materials may be intrinsic semiconductors, or may be doped during or after their initiation formation to become an extrinsic p or n type semiconductors, as desired. At this point, the method may proceed to block 505, wherein a gate may be formed proximate the channel. The gate may consist of a column of an electrostrictive material that elongates upon application of an electrical input to the gate. Elongation of the column applies a force on the channel, which in turn reduces the bandgap between the consecutive layers of two-dimensional material. At this point, the method may proceed to block 506 and end.

Figure 6:
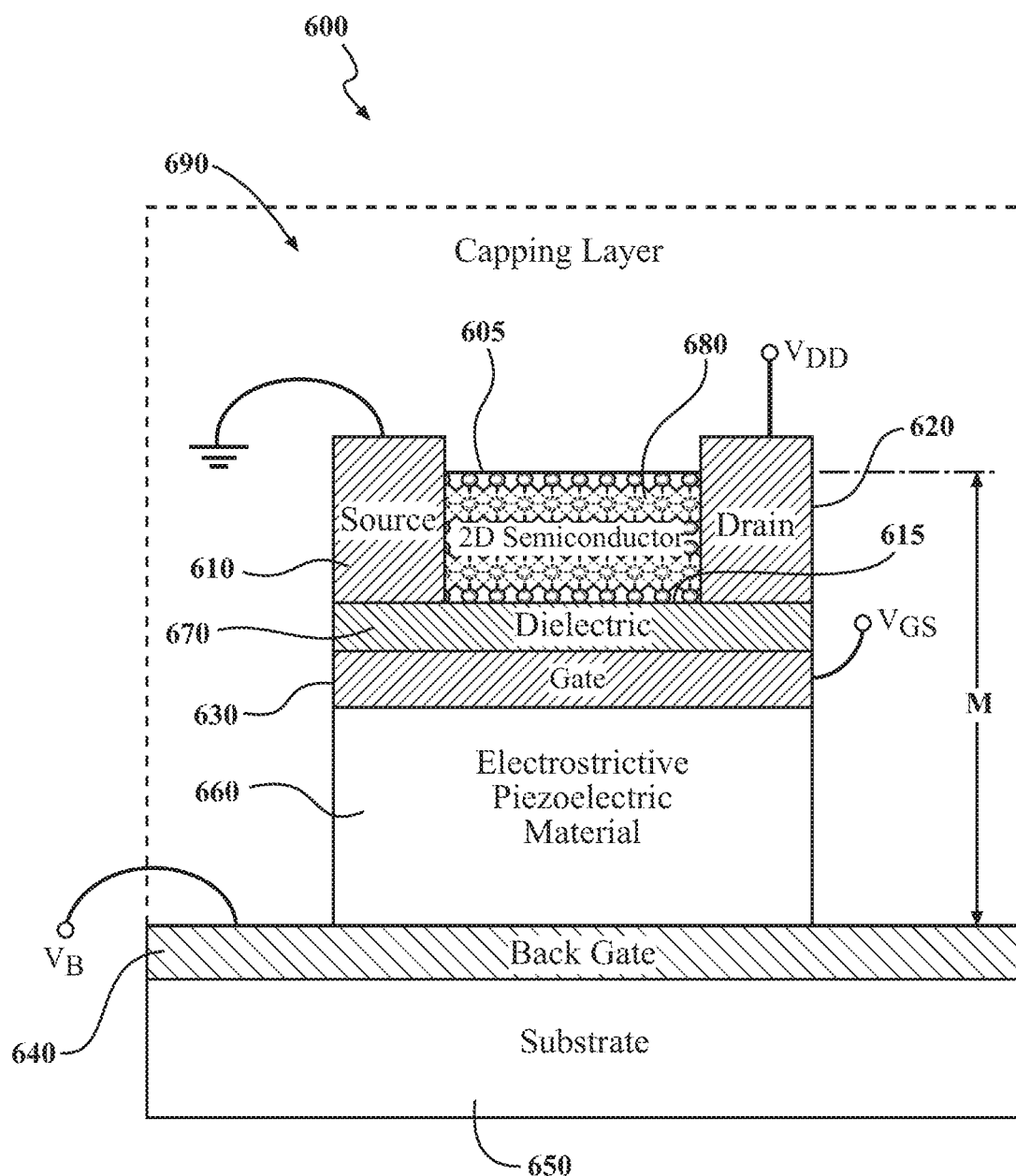
FIG. 6 is a cross-sectional block diagram of a 2D-EFET according to another embodiment of the present invention.

FIG. 6 is a cross-sectional block diagram of a 2D-EFET according to another embodiment of the present invention. The embodiment 600 shown in the FIG. 6 has four terminals i.e. source 610, drain 620, gate 630, back gate 640, and a capping layer 690. The 2D-EFET 600 may be manufactured by depositing a layer of the back gate 640 on a substrate 650. Consecutive layers of a gate 630, and a dielectric 670 may be deposited on the back gate 640. The gate 630 includes a column of electrostrictive material 660 that is deposited on the back gate 640. The source 610, drain 620, and at least one layer of 2D material 680 may be provided on the dielectric layer 670. The 2D material 680 comprises a first surface 605 toward the capping layer 690 and a second surface 615 toward the dielectric 670. According to a non-limiting embodiment, the resulting assembly of the electrostrictive material 660, gate 630, dielectric 670, source 610, drain 620, and at least one layer of 2D material 680 may be enclosed and/or encapsulated by the capping layer 690 on the back gate 640. As discussed above, electrostrictive materials exhibit a dimensional change upon application of an electric field due to the energy increase associated with the polarization induced by the electric field in the material. In other words, this is a form of elastic deformation of an electrostrictive material induced by an electric field. The resulting assembly ensures that due to the dimensional change of the electrostrictive material 660, a distance M between the first surface 605 and the back gate 640 does not change. It should be noted that the resulting assembly might be encapsulated/restrained in other ways. Thus, the dimensional change of the electrostrictive material 660 transduces an out-of-plane stress on the 2D material 680 and monotonically reduces the bandgap of the 2D material 680 to zero. The four terminal 2D-EFET 600 separates the band gap modulation function from the field effect function. Applying a gate voltage $V_{GS}$, modulates the band position similar to the 2D-EFET 10 shown in FIGS. 1a and 1b. This voltage also produces a significant electric field in the electrostrictive material 660, therefore actuating it and compressing the 2D material 680. This bandgap modulation occurs in parallel to the FET action. The structure of 2D-EFET 600 has an advantage that the electrostrictive/piezoelectric material 660 does not need to be integrated directly onto the 2D material 680.

The amount of deformation of the electrostrictive material 660 may vary depending on the composition of the electrostrictive material and/or the terminal voltage(s). In some embodiments, the amount of elongation of the electrostrictive material is such that the 2D material 680 with a large bandgap transitions into 2D material 680 that has a small bandgap. In other embodiments, the amount of elongation of the electrostrictive material 660 is such that the bandgap of the 2D material 680 substantially reduces to zero and thereby exhibit characteristics of a metal in the ON state. Similar to as shown in FIG. 1c, the 2D material 680 of some embodiments of the present disclosure may have a plurality of cascaded consecutive 2D material layers 680 of the two-dimensional material in 2D-EFET 600.

Electrostrictive materials, whether grown by sol-gel, epitaxy, sputter or pulsed laser deposition, generally require high processing temperatures which can adversely affect the 2D semiconductor properties. For at least this reason, it is advantageous to integrate the 2D material after the electrostrictive material deposition. The four terminal operation of the 2D-EFET 600, potentially offers additional circuit functionality, allowing for complete and independent characterization of the FET and bandgap modulation behavior. When voltages are applied to the source 610, drain 620, gate 630, and back gate 640, the FET and band gap modulation behavior can be individually activated. The structure of the 2D-EFET 600 also removes the interface trap density requirement of the 2D-EFET 10 shown in FIGS. 1a and 1b.

Figure 7A:
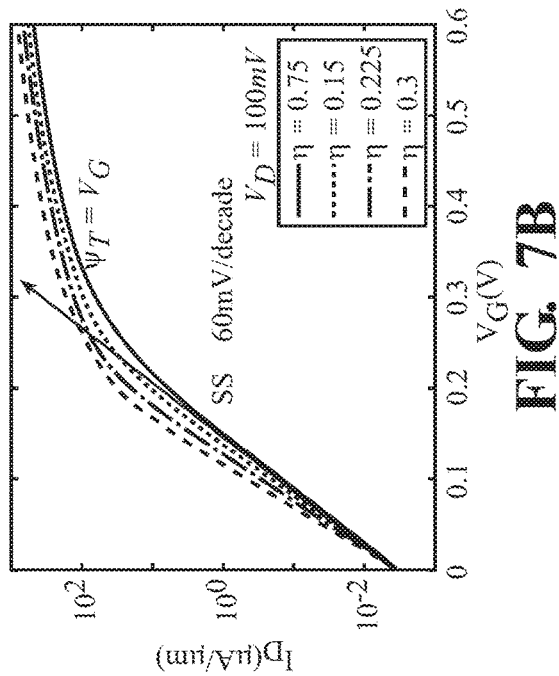
FIG. 7a shows simulated 2D-EFET characteristics of Total surface potential $\psi_T$ versus $V_G$ for different values of the strain transfer coefficient $\eta$.
Figure 7B:
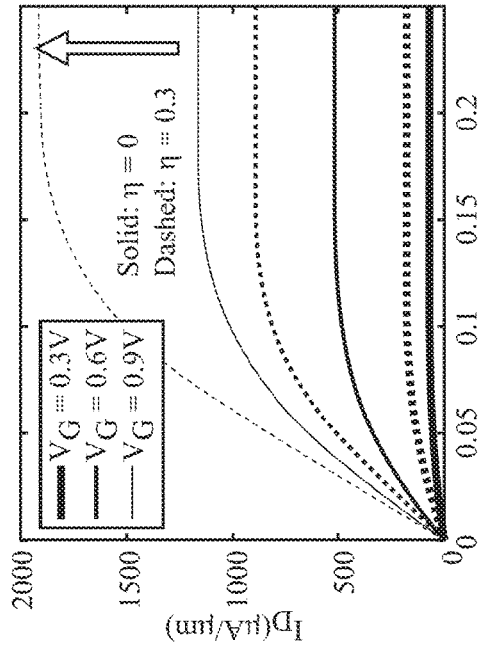
FIG. 7b shows simulated 2D-EFET characteristics of $I_D$ versus $V_G$ characteristics showing a sub 60 mV/dec subthreshold slope.
Figure 7C:
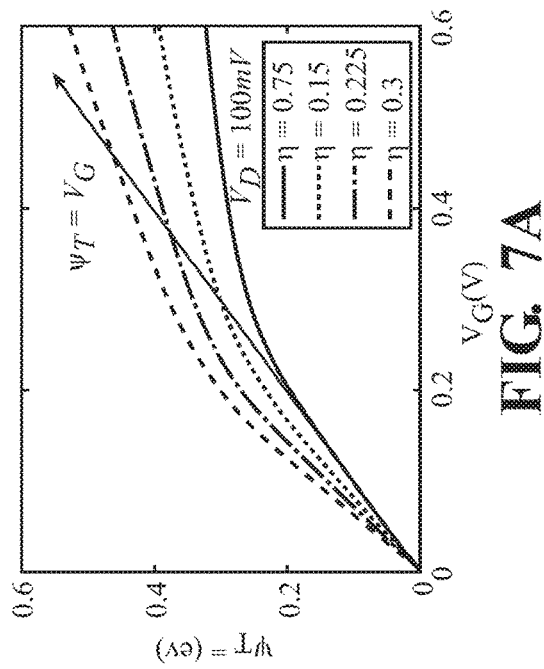
FIG. 7c shows simulated 2D-EFET characteristics of subthreshold slope as a function of the strain transfer coefficient $\eta$.
Figure 7D:
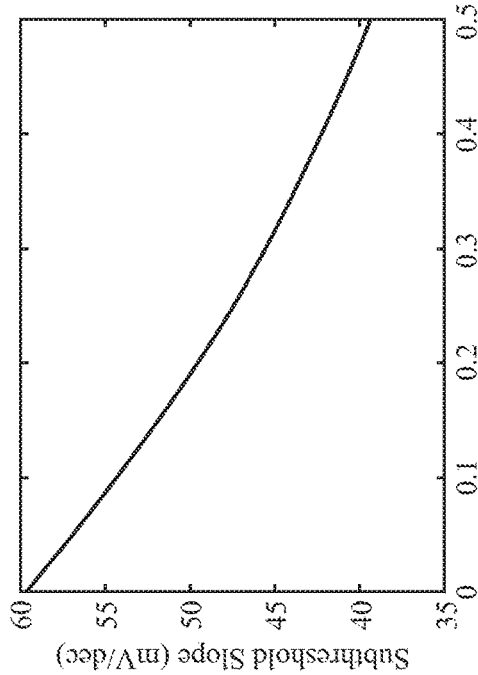
FIG. 7d shows simulated 2D-EFET characteristics of $I_D$ vs. $V_D$ characteristics showing saturation and dramatically increased ON currents.

The characteristics of the 2D-EFET 600 were modeled using the Landauer transport model. The band movement due to the electrostrictive material is given by the following equation $$\psi_E = (\eta)\left(\alpha C_{33,2D}\frac{1}{t_{2D}}\right)(d_{33})V_G \tag{11}$$

where, $\eta$ is the strain transfer coefficient or the fraction of the electrostrictive material displacement transferred into the 2D material, $\alpha$ is the bandgap coefficient (meV in bandgap reduction per GPa of applied stress), $C_{33}$ is the 2D material out of plane compliance, $t_{2D}$ is the channel thickness, $d_{33}$ is the piezo electric coefficient, and $V_G$ is the applied gate voltage. From the self-consistent calculations, FIG. 7a shows that in the switching regime, the total band movement exceeds the applied gate voltage, hence internal voltage amplification. An increase in the values of $\eta$ results in an additional amplification due to the more efficient strain transfer. FIGS. 7b and 7c, respectively, show the $I_D$-$V_G$ characteristics, and subthreshold slope characteristics for an increase in the values of $\eta$. The 2D-EFET 600 device saturates similarly to a traditional MOSFET but with dramatically increased ON currents as shown in FIG. 7d. FIG. 7d shows that the standard requirement for the high performance FETs (i.e. $I_{ON}$=1 mA/μm and $I_{ON}/I_{OFF}$=$10^4$) can be achieved by the 2D-EFET.

Figure 8:
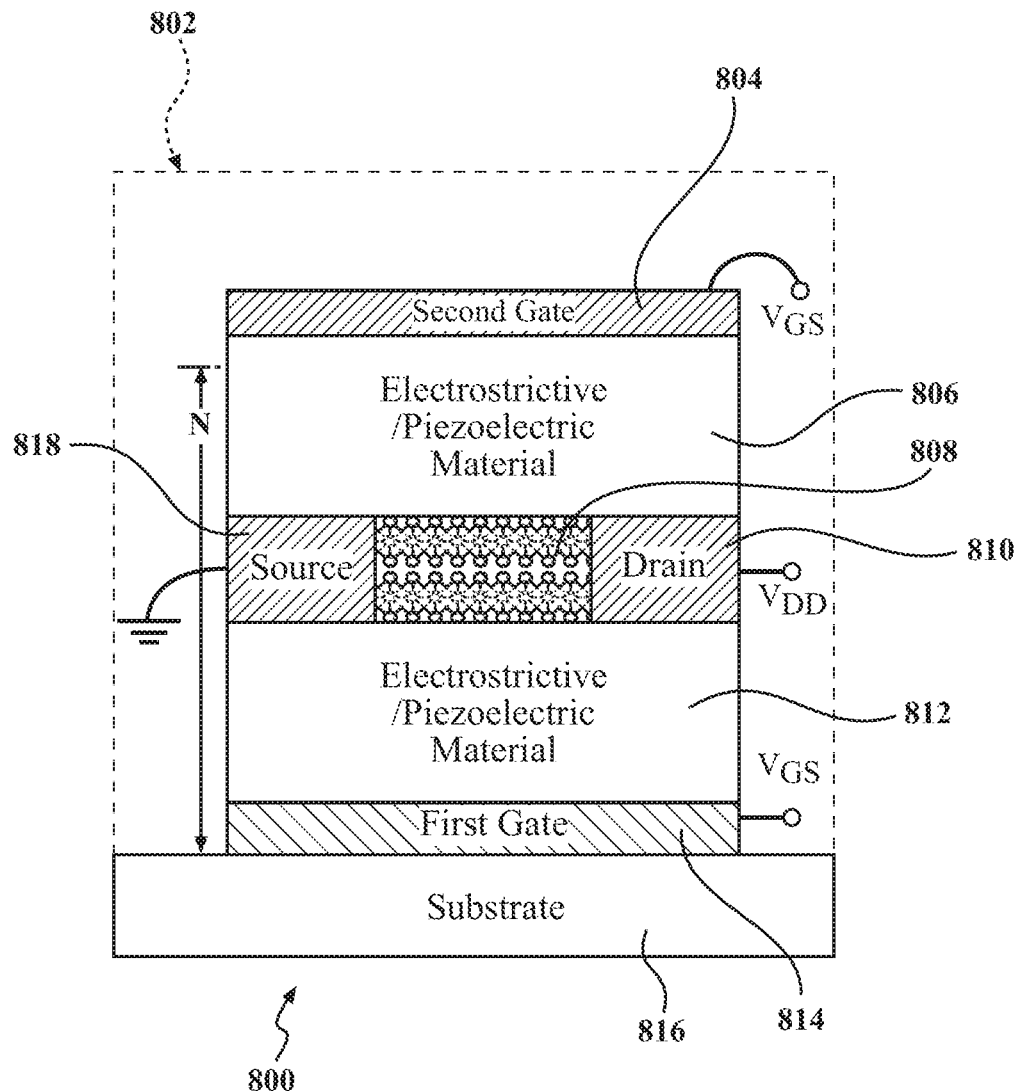
FIG. 8 is a cross-sectional block diagram of a 2D-EFET according to another embodiment of the present invention.

FIG. 8 is a cross-sectional block diagram of a 2D-EFET according to another embodiment of the present invention. The embodiment 800 shown in the FIG. 8 has four terminals i.e. source 818, drain 810, first gate 814, second gate 804, and a capping layer 802. The 2D-FET 800 may be manufactured by depositing a layer of the first gate 814 on a substrate 816. Consecutive layers of a 2D-material 808, and the second gate 804 may be deposited on the first gate 814. The first gate 814 and the second gate 804 respectively include columns of electrostrictive material 812, and electrostrictive material 806 that are deposited toward the 2D-material 808. The source 818 and drain 810 are connected to the columns of electrostrictive material 812 and 806 toward an opposing side away from the first gate 814 and second gate 804, respectively. According to a non-limiting embodiment, the resulting assembly of electrostrictive material 806, electrostrictive material 812, first gate 814, second gate 804, source 818, drain 810, and at least one layer of 2D material 808 may be enclosed and capsuled by the capping layer 816. As discussed above, electrostrictive materials exhibit a dimensional change upon application of an electric field due to the energy increase associated with the polarization induced by the electric field in the material. In other words, this is a form of elastic deformation of an electrostrictive material induced by an electric field. The resulting assembly ensures that due to the dimensional change of the electrostrictive materials 806, 812, a distance N between the first gate 814 and the second gate 804 does not change. It should be noted that the resulting assembly might be encapsulated/restrained in other ways. Thus, the longitudinal expansion of the electrostrictive materials 806, 812 transduces an out-of-plane stress on the 2D material 808 from both sides and monotonically reduces the bandgap of the 2D material 808 to zero. Applying a gate voltage $V_{GS}$, modulates the band position similar to the 2D-EFET 10 shown in FIGS. 1a and 1b. This voltage also produces a significant electric field in the electrostrictive materials 806, 812, therefore actuating them and compressing the 2D material 808.

The amount of deformation of the electrostrictive materials 806, 812 may vary depending on the composition of the electrostrictive material and/or the terminal voltage(s). In some embodiments, the amount of elongation of the electrostrictive material is such that the 2D material 808 with a large bandgap transitions into 2D material 808 that has a small bandgap. In other embodiments, the amount of elongation of the electrostrictive materials 806, 812 is such that the bandgap of the 2D material 808 substantially reduces to zero and thereby exhibit characteristics of a metal in the ON state. Similar to as shown in FIG. 1c, the 2D material 808 of some embodiments of the present disclosure may have a plurality of cascaded consecutive 2D material layers 808 of the two-dimensional material in 2D-EFET 800.

Figure 2A:
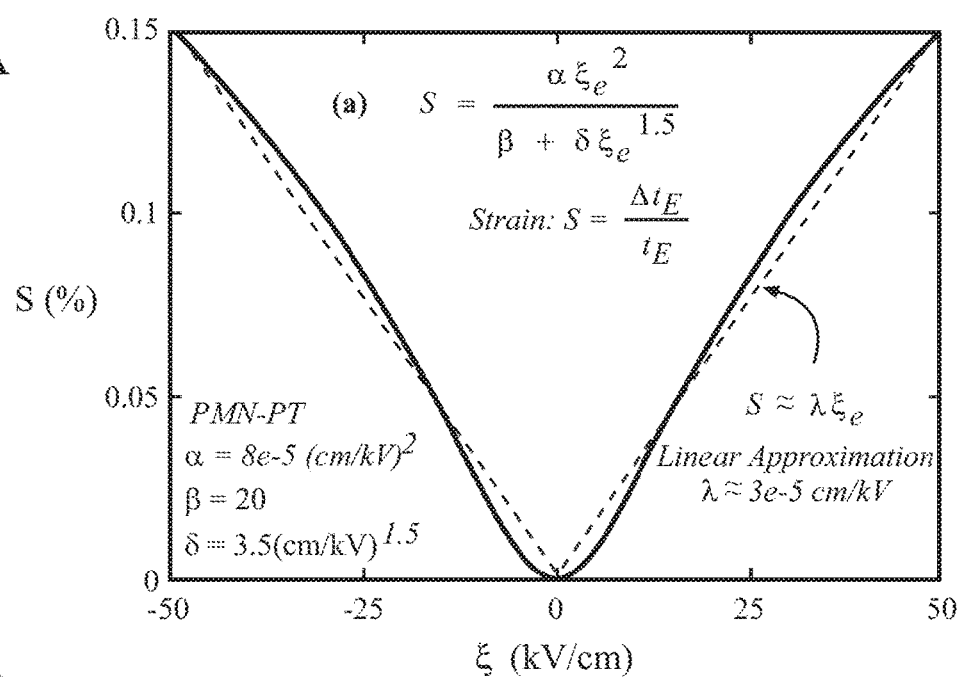
FIG. 2a is a graphical representation of strain (S) versus electric field ($\xi_e$) characteristics of an electrostrictive material such as lead magnesium niobate-lead titanate (PMN-PT)
Figure 2D:
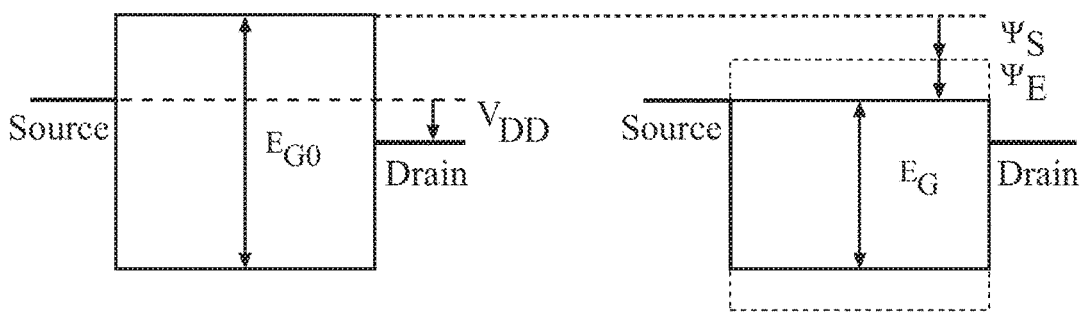
FIG. 2d is a schematic showing band movement in a 2D-EFET in response to an applied gate bias ($V_{GS}$)
Figure 2B:
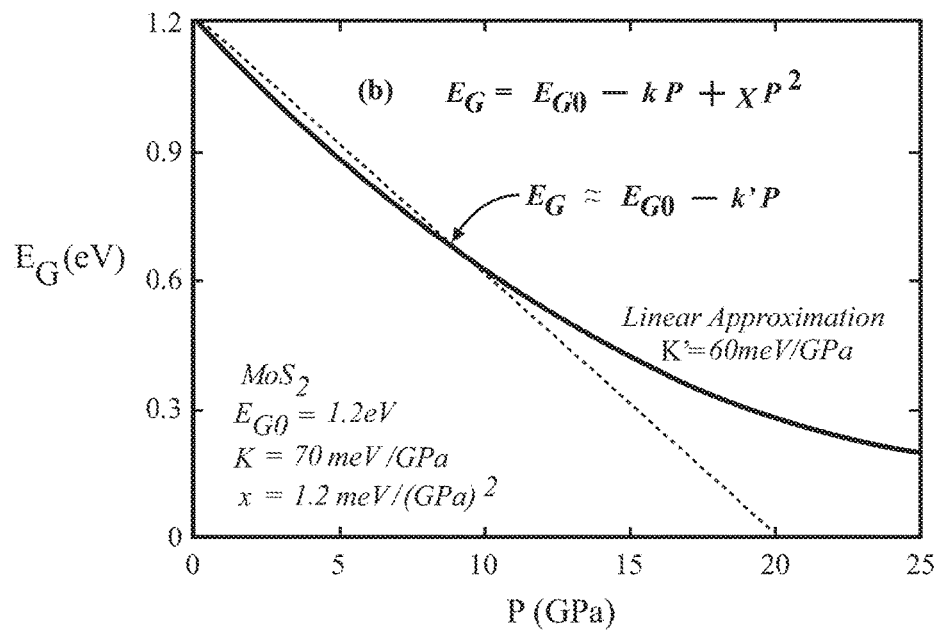
FIG. 2b is a graphical representation of bandgap ($E_G$) versus out-of-plane stress (P) characteristics of a 2D material ($MoS_2$)
Figure 2C:
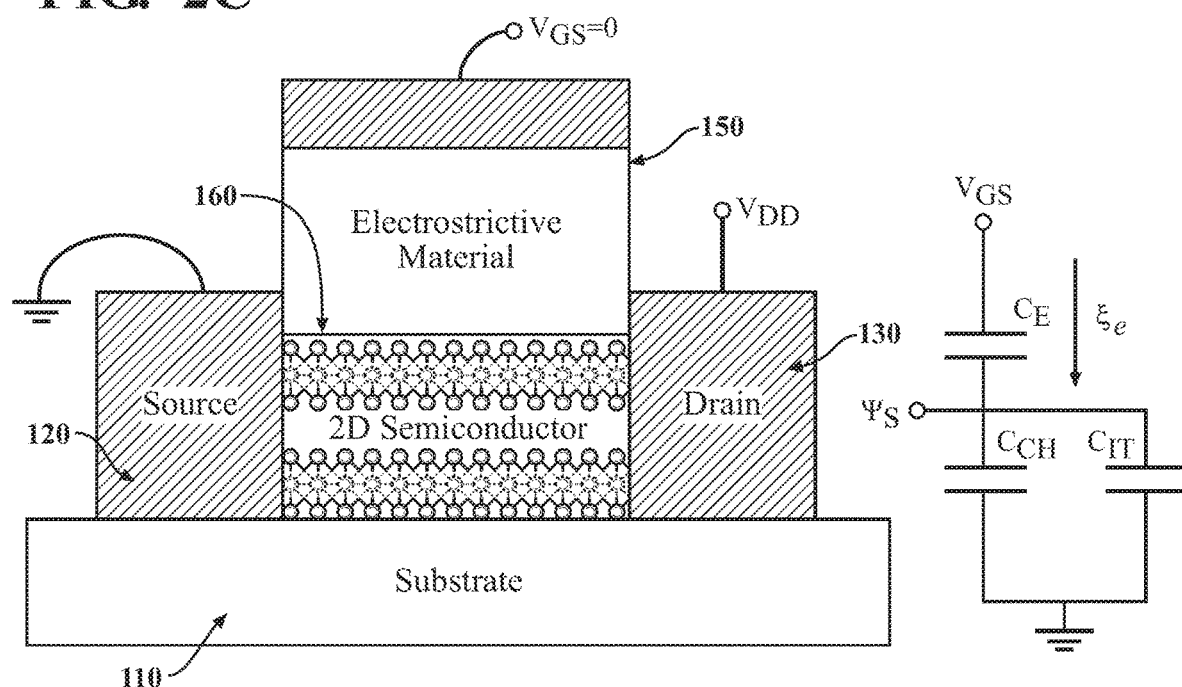
FIG. 2c is a cross-sectional block diagram of a 2D-EFET and its equivalent capacitive circuit network.

The 2D material 140 of FIGS. 1b, 1c, 2D material 680 of FIG. 6, 2D material 808 of FIG. 8 or any other 2D material used in an embodiment of a 2d-EFET according to the present disclosure or an embodiment manufactured according to the method of the present disclosure may consist of a semiconductor $MX_2$, wherein M is a transition metal atom like Molybdenum (Mo), Tungsten (W) or Tin (Sn) and X is a chalcogen atom of Sulphur (S), Selenium (Se) or Tellurium (Te). The 2D material in the embodiments of this disclosure have a variable bandgap. The 2D material is configured in the 2D-EFET such that at least one bandgap characteristic of the variable bandgap 2D material dynamically changes in response to at least the elongation or dimensional change of the electrostrictive materials.

According to the embodiments disclosed in this disclosure, the sequence of depositing or creating one layer next to another layer of the 2D-EFET may vary depending on the manufacturing technique or process.

In the conclusion, a novel and disruptive device concept called 2D-EFET is proposed based on strain transduction and dynamic bandgap engineering in the 2D material, which provides a solution for the post silicon, ultra-low power, high performance, and aggressively scalable device technology.

The terms and expressions which have been employed herein are used as terms of description and not of limitation, and there is no intention, in the use of such terms and expressions, of excluding any equivalents of the features shown and described (or portions thereof), and it is recognized that various modifications are possible within the scope of the claims. Accordingly, the claims are intended to cover all such equivalents. Various features, aspects, and embodiments have been described herein. The features, aspects, and embodiments are susceptible to combination with one another as well as to variation and modification, as will be understood by those having skill in the art. The present disclosure should, therefore, be considered to encompass such combinations, variations, and modifications.

REFERENCES (INCORPORATED HEREIN, IN THEIR ENTIRETY, BY REFERENCE)

1 Dennard, R. H., Rideout, V., Bassous, E. & LeBlanc, A. Design of ion-implanted MOSFET's with very small physical dimensions. *Solid-State Circuits, IEEE Journal of* 9, 256-268 (1974).
2 Frank, D. J. et al. Device scaling limits of Si MOSFETs and their application dependencies. *Proceedings of the IEEE* 89, 259-288 (2001).
3 Haensch, W. et al. Silicon CMOS devices beyond scaling. *IBM Journal of Research and Development* 50, 339-361 (2006).
4 Avouris, P., Chen, Z. & Perebeinos, V. Carbon-based electronics. *Nature nanotechnology* 2, 605-615 (2007).
5 Franklin, A. D. & Chen, Z. Length scaling of carbon nanotube transistors. *Nature nanotechnology* 5, 858-862 (2010).
6 Appenzeller, J. et al. Toward nanowire electronics. *Electron Devices, IEEE Transactions on* 55, 2827-2845 (2008).
7 Li, Y., Qian, F., Xiang, J. & Lieber, C. M. Nanowire electronic and optoelectronic devices. *Materials today* 9, 18-27 (2006).
8 Das, S., Robinson, J. A., Dubey, M., Terrones, H. & Terrones, M. Beyond graphene: Progress in novel two-dimensional materials and van der waals solids. *Annual Review of Materials Research* 45, 1-27 (2015).
9 Radisavljevic, B., Radenovic, A., Brivio, J., Giacometti, V. & Kis, A. Single-Layer $MoS_2$ Transistors. *Nature Nanotechnology* 6, 147-150 (2011).
10 Das, S., Chen, H.-Y., Penumatcha, A. V. & Appenzeller, J. High performance multilayer MoS2 transistors with scandium contacts. *Nano letters* 13, 100-105 (2012).
11 Das, S. & Appenzeller, J. WSe2 field effect transistors with enhanced ambipolar characteristics. *Applied Physics Letters* 103, 103501 (2013).
12 Das, S., Demarteau, M. & Roelofs, A. Ambipolar phosphorene field effect transistor. *ACS nano* 8, 11730-11738 (2014).
13 Butler, S. Z. et al. Progress, challenges, and opportunities in two-dimensional materials beyond graphene. *ACS nano* 7, 2898-2926 (2013).
14 Meric, I. et al. Current saturation in zero-bandgap, top-gated graphene field-effect transistors. *Nature nanotechnology* 3, 654-659 (2008).
15 Lu, H. & Seabaugh, A. Tunnel field-effect transistors: state-of-the-art. *Electron Devices Society, IEEE Journal of the* 2, 44-49 (2014).
16 Das, S., Prakash, A., Salazar, R. & Appenzeller, J. Toward low-power electronics: tunneling phenomena in transition metal dichalcogenides. *ACS nano* 8, 1681-1689 (2014).
17 van Hemert, T. & Hueting, R. J. Piezoelectric strain modulation in FETs. *IEEE transactions on electron devices* 60, 3265-3270 (2013).

18 Salahuddin, S. & Datta, S. Use of negative capacitance to provide voltage amplification for low power nanoscale devices. *Nano letters* 8, 405-410 (2008).

19 Bourianoff, G. I., Gargini, P. A. & Nikonov, D. E. Research directions in beyond CMOS computing. *Solid-State Electronics* 51, 1426-1431 (2007).

20 Behin-Aein, B., Datta, D., Salahuddin, S. & Datta, S. Proposal for an all-spin logic device with built-in memory. *Nature Nanotechnology* 5, 266-270 (2010).

21 Banerjee, S. K., Register, L. F., Tutuc, E., Reddy, D. & MacDonald, A. H. Bilayer PseudoSpin Field-Effect Transistor (BiSFET): A Proposed New Logic Device. *IEEE Electron Device Letters* 30, 158-160 (2009).

22 Nayak, A. P. et al. Pressure-induced semiconducting to metallic transition in multilayered molybdenum disulphide. *Nature communications* 5 (2014).

23 Kumar, A. & Ahluwalia, P. Semiconductor to metal transition in bilayer transition metals dichalcogenides MX2 (M=Mo, W; X=S, Se, Te). *Modelling and Simulation in Materials Science and Engineering* 21, 065015 (2013).

24 Coondoo, I., Panwar, N. & Kholkin, A. Lead-free piezoelectrics: Current status and perspectives. *Journal of Advanced Dielectrics* 3, 1330002 (2013).

25 Pham, K.-N. et al. Giant strain in Nb-doped Bi 0.5 (Na 0.82 K 0.18) 0.5 TiO 3 lead-free electromechanical ceramics. *Materials Letters* 64, 2219-2222 (2010).

26 Hussain, A., Ahn, C. W., Lee, J. S., Ullah, A. & Kim, I. W. Large electric-field-induced strain in Zr-modified lead-free Bi 0.5 (Na 0.78 K 0.22) 0.5 TiO 3 piezoelectric ceramics. *Sensors and Actuators A: Physical* 158, 84-89 (2010).

27 Lundstrom, M. & Guo, J. *Nanoscale transistors: device physics, modeling and simulation*. (Springer Science & Business Media, 2006).

The invention claimed is:

1. A two-dimensional electrostrictive field effect transistor comprising:
    a substrate having a surface;
    a source;
    a drain;
    a channel with a bandgap disposed between the source and the drain, the channel being a two-dimensional layered material, the bandgap of the channel being switchable between a first bandgap and a second bandgap, the first bandgap being larger than the second bandgap;
    a gate having a column of an electrostrictive or piezoelectric or ferroelectric material, wherein an electrical input to the gate produces an elongation of the column from a length L1 to a length L2, the length L2 being greater than the length L1;
    the transistor switchable between an off state and an on state, the column having the length L1 in the off state, the column having the length L2 after the electrical input is applied to the gate, the channel having the first bandgap in the off state; and
    a capping, the substrate, the source, the drain, and the channel being embedded inside the capping, the capping directly contacting the surface of the substrate, the gate disposed such that the elongation of the column of the gate from the length L1 to the length L2 due to the electrical input applies a force on the channel and dynamically reduces the first bandgap of the two-dimensional layered material to the second bandgap thereby switching the transistor to the on state,
    wherein removal of the electrical input produces dimensional change in the column from the length L2 to the length L1 thereby removing the force on the channel, dynamically increasing the second bandgap to the first bandgap and switching the transistor to the off state.

2. The two-dimensional electrostrictive field effect transistor of claim 1, wherein the two-dimensional layered material comprises a semiconductor of $MX_2$, wherein M is a transition metal atom of Molybdenum (Mo), Tungsten (W) or Tin (Sn) and X is a chalcogen atom of Sulphur (S), Selenium (Se) or Tellurium (Te).

3. The two-dimensional electrostrictive field effect transistor of claim 1, wherein the elongation of the column is such that the channel transitions from an insulator or large bandgap semiconductor to a metal or small bandgap semiconductor.

4. The two-dimensional electrostrictive field effect transistor of claim 1, wherein the electrical input to the gate is a voltage.

5. The two-dimensional electrostrictive field effect transistor of claim 1, wherein the elongation of the column is such that the bandgap of the two-dimensional layered material of the channel substantially decreases to zero.

6. The two-dimensional electrostrictive field effect transistor of claim 1, wherein the channel has two or more layers of the two-dimensional layered material.

7. The two-dimensional electrostrictive field effect transistor of claim 1, wherein the two-dimensional electrostrictive field effect transistor has a subthreshold swing of less than 60 mV/decade.

8. The two-dimensional electrostrictive field effect transistor of claim 1, further comprising:
    another gate having another column of an electrostrictive or piezoelectric or ferroelectric material, the electrical input to the another gate produces an elongation of the another column; and
    the channel having a first surface and a second surface, wherein the column of the gate applies the force on the first surface of the channel and the another gate is disposed such that the elongation of the another column applies another force on the second surface of the channel and reduces the bandgap of the two-dimensional layered material.

9. A method of manufacturing a two-dimensional electrostrictive field effect transistor comprising:
    forming a substrate having a surface;
    forming a source;
    forming a drain;
    forming a channel of two-dimensional layered material and disposing the channel between the source and the drain, the channel having a bandgap that is switchable between a first bandgap and a second bandgap, the first bandgap being larger than the second bandgap;
    forming a gate proximate the channel, the gate comprising a column of an electrostrictive or piezoelectric or ferroelectric material, the two-dimensional electrostrictive field effect transistor configured such that applying an electrical input to the gate produces an elongation of the column from a length L1 to a length L2, the length L2 being greater than the length L1, the transistor being switchable between an off state and an on state, the column having the length L1 in the off state, the column having the length L2 after the electrical input is applied to the gate, the channel having the first bandgap in the off state;
    providing a capping; and embedding the substrate, the gate, the source, the drain and the channel inside the capping, with the capping directly contacting the surface of the substrate, such that the elongation of the column of the gate from the length L1 to the length L2 due to the electrical input to the gate applies a force or mechanical stress on the channel and dynamically reduces the first bandgap of the two-dimensional layered material to the second bandgap thereby switching the transistor to the on state, wherein removal of the electrical input produces dimensional change in the column from the length L2 to the length L1 thereby removing the force on the channel, dynamically increasing the second bandgap to the first bandgap and switching the transistor to the off state.

10. The method of claim 9, wherein the two-dimensional layered material comprises semiconductor of $MX_2$, wherein M is a transition metal atom of Molybdenum (Mo), Tungsten (W) or Tin (Sn) and X is a chalcogen atom of Sulphur (S), Selenium (Se) or Tellurium (Te).

11. The method of claim 9, wherein the step of forming the gate comprises forming the column of an electrostrictive or piezoelectric or ferroelectric material whose elongation applies the force such that the channel transitions from an insulator or large bandgap semiconductor to a metal or small bandgap semiconductor.

12. The method of claim 9, further applying a voltage as the electrical input to the gate to produce the elongation of the column.

13. The method of claim 9, further configuring the two-dimensional electrostrictive field effect transistor such that the elongation of the column decreases the bandgap of the two-dimensional material of the channel to substantially zero.

14. The method of claim 9, wherein the step of forming the channel comprises forming the channel from two or more layers of the two-dimensional layered material.

15. The method of claim 9, wherein the two-dimensional electrostrictive field effect transistor has a subthreshold swing of less than 60 mV/decade.

16. The method of claim 9, further comprising forming a second gate, wherein the channel being disposed between the gate and the second gate, the second gate having a second column of an electrostrictive or piezoelectric or ferroelectric material, the second gate producing an elongation of the second column that applies a force or mechanical stress on the channel and reduces the bandgap of the two-dimensional layered material.

* * * * *